(12) United States Patent
Kurosawa et al.

(10) Patent No.: US 7,317,209 B2
(45) Date of Patent: Jan. 8, 2008

(54) THIN FILM TRANSISTOR DEVICE AND METHOD OF MANUFACTURING THE SAME, THIN FILM TRANSISTOR SUBSTRATE AND DISPLAY HAVING THE SAME

(75) Inventors: Yoshio Kurosawa, Kawasaki (JP); Kazushige Hotta, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 397 days.

(21) Appl. No.: 10/612,414

(22) Filed: Jul. 2, 2003

(65) Prior Publication Data

US 2004/0048422 A1    Mar. 11, 2004

(30) Foreign Application Priority Data

Jul. 5, 2002    (JP)    ............................. 2002-197880

(51) Int. Cl.
*H01L 29/04*    (2006.01)
(52) U.S. Cl. .......................... 257/72; 257/59; 257/347; 257/350; 257/408; 349/42; 349/43; 349/47
(58) Field of Classification Search .................... None
See application file for complete search history.

(56) References Cited

U.S. PATENT DOCUMENTS

| | | | |
|---|---|---|---|
| 5,055,899 A | | 10/1991 | Wakai et al. |
| 5,166,085 A | | 11/1992 | Wakai et al. |
| 5,396,084 A | * | 3/1995 | Matsumoto .................. 257/72 |
| 5,585,647 A | * | 12/1996 | Nakajima et al. ............. 257/72 |
| 5,877,514 A | | 3/1999 | Seo |
| 5,969,377 A | | 10/1999 | Seo |
| 6,037,195 A | | 3/2000 | Toriyama et al. |
| 6,225,150 B1 | | 5/2001 | Lee et al. |
| 6,225,644 B1 | | 5/2001 | Yamaguchi et al. |
| 6,603,453 B2 | * | 8/2003 | Yamazaki et al. ............ 345/92 |
| 6,614,076 B2 | * | 9/2003 | Kawasaki et al. .......... 257/350 |
| 6,624,473 B1 | * | 9/2003 | Takehashi et al. .......... 257/344 |
| 6,864,134 B1 | * | 3/2005 | Satou et al. ................ 438/197 |
| 2001/0052950 A1 | * | 12/2001 | Yamazaki et al. ............ 349/43 |

FOREIGN PATENT DOCUMENTS

| | | |
|---|---|---|
| EP | 0 361 609 | 4/1990 |
| JP | 60-160170 | 8/1985 |
| JP | 2-224254 | 9/1990 |
| JP | 04-260336 | 9/1992 |
| JP | 09-191111 | 7/1997 |
| JP | 11-163366 | 6/1999 |
| JP | 2000-036598 | 2/2000 |
| JP | 2001-168346 | 6/2001 |

* cited by examiner

*Primary Examiner*—Evan Pert
*Assistant Examiner*—Fazli Erdem
(74) *Attorney, Agent, or Firm*—Greer, Burns & Crain, Ltd.

(57) ABSTRACT

In a method for manufacturing a TFT device, a metal thin film is formed on a gate insulation film. Patterning is performed to remove the metal thin film on a semiconductor layer, and phosphorous ions are implanted using the patterned metal thin film as a mask to form the source and drain regions. The patterned metal thin film is further patterned to form a gate electrode of an n-type TFT. Phosphorous ions are implanted using the gate electrode as a mask to form LDD regions between the source and drain regions and a channel region.

4 Claims, 15 Drawing Sheets

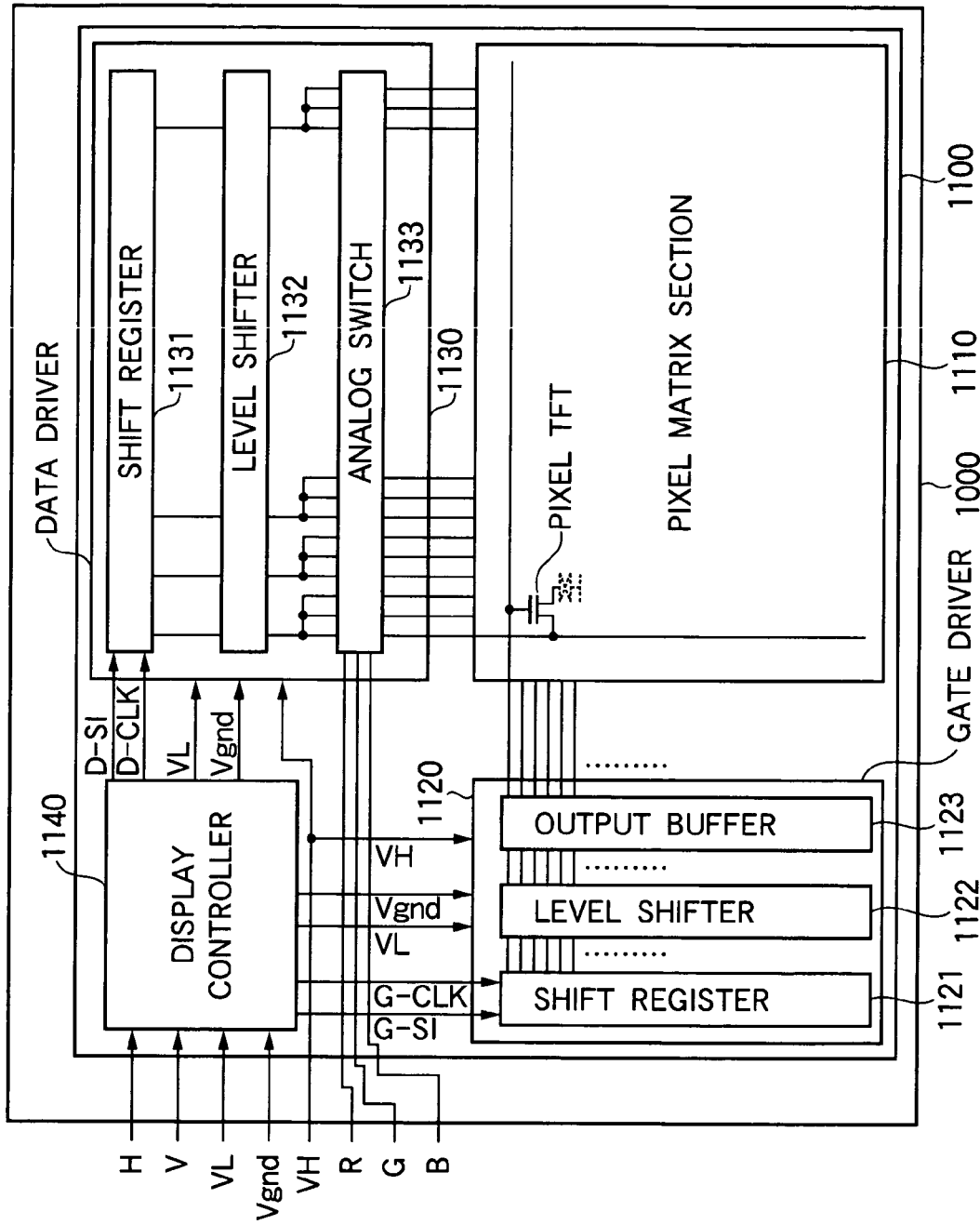

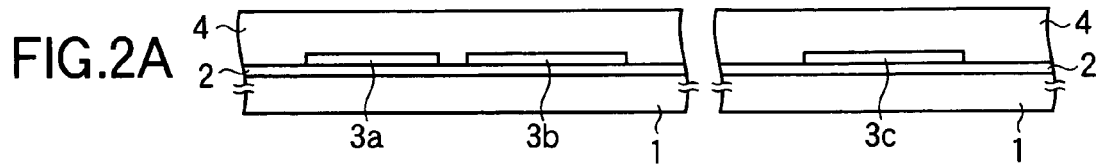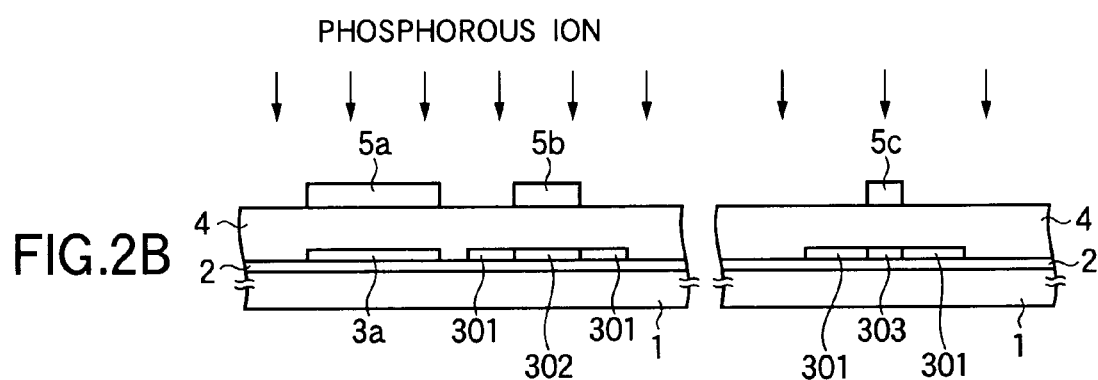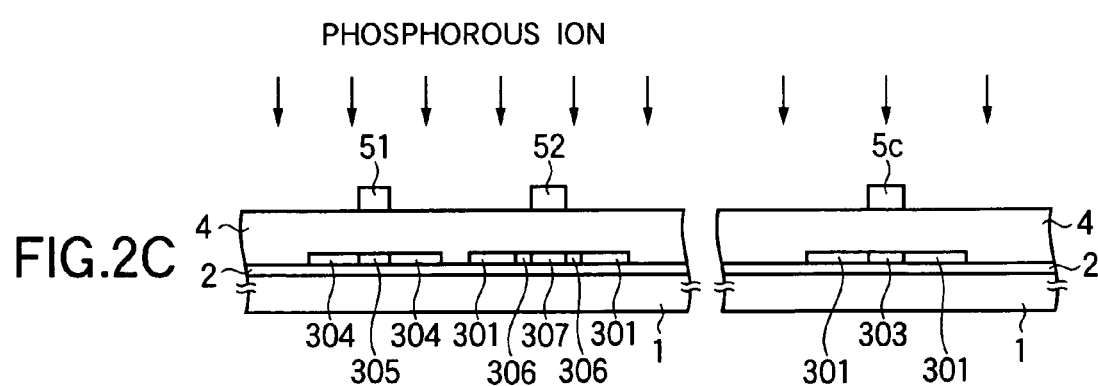

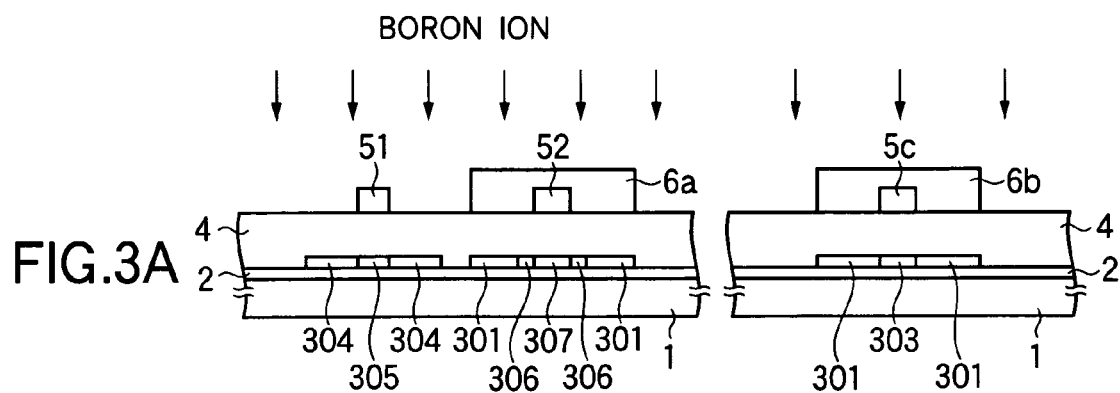
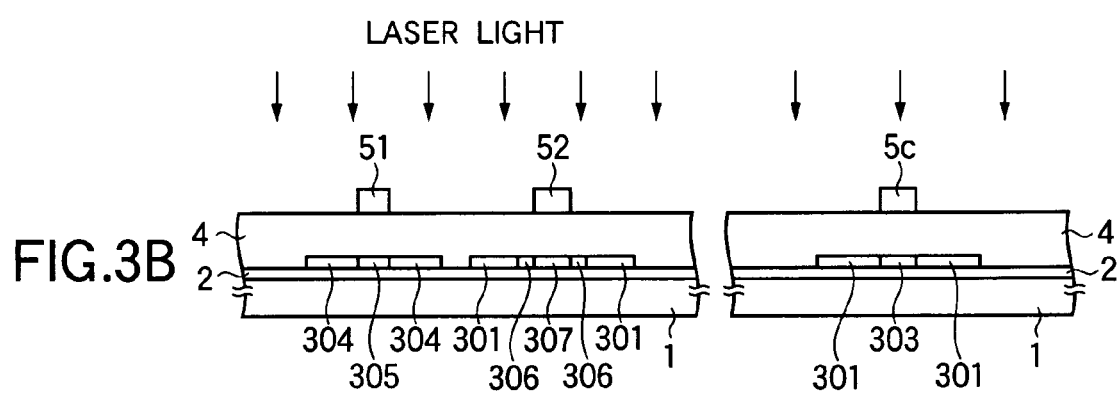
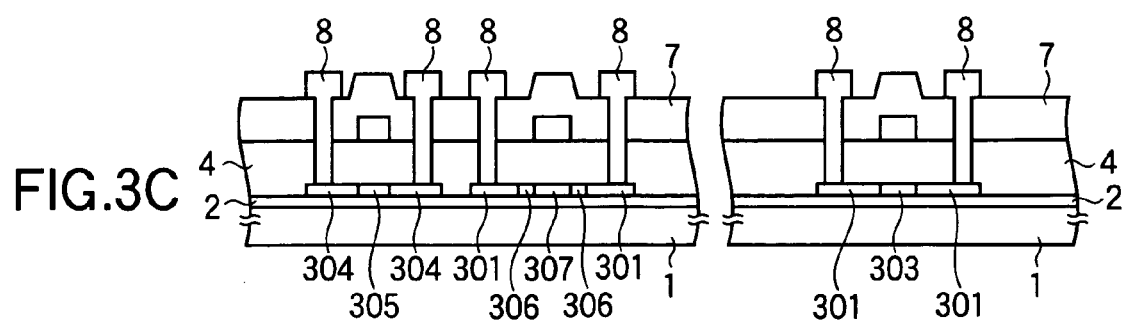

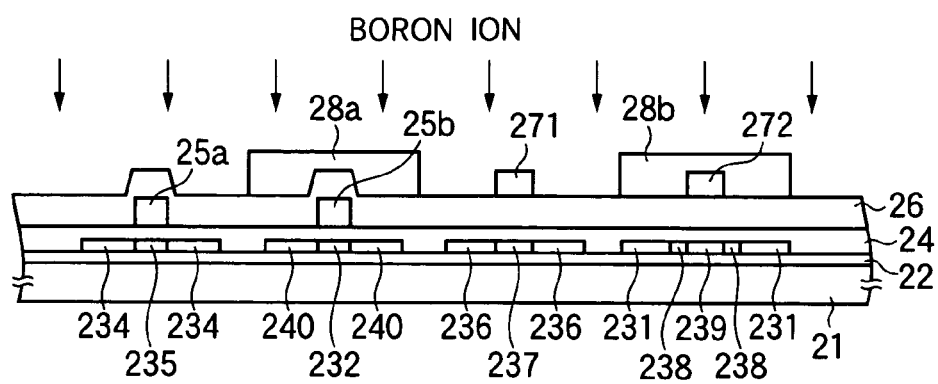
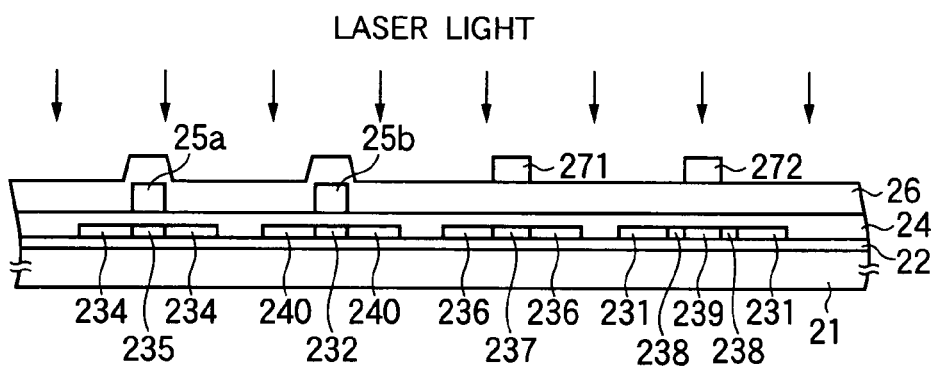
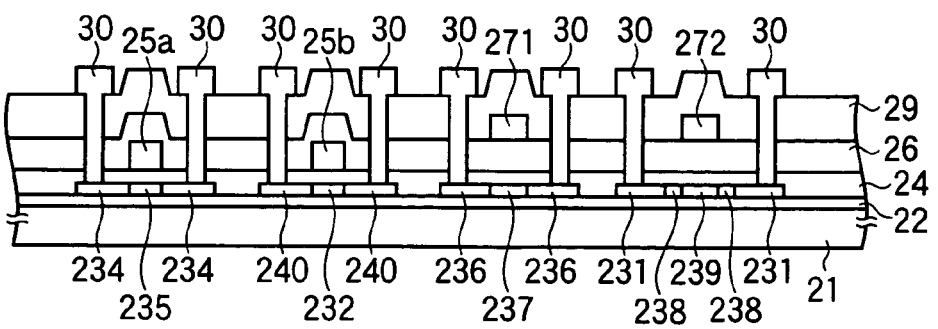

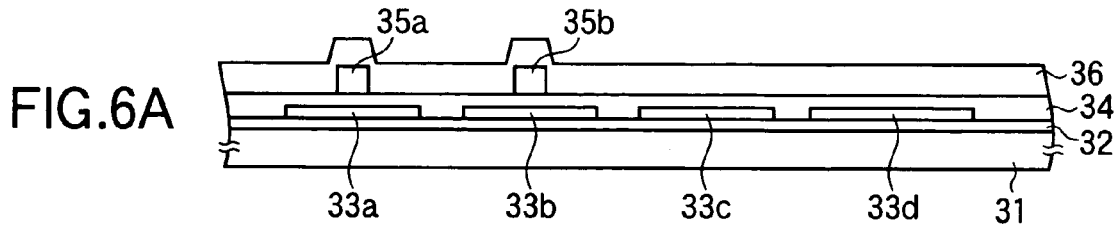
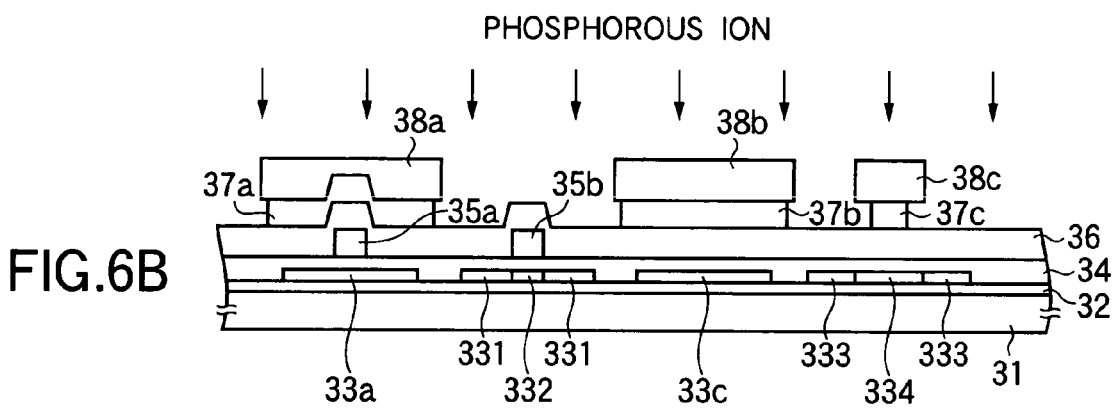
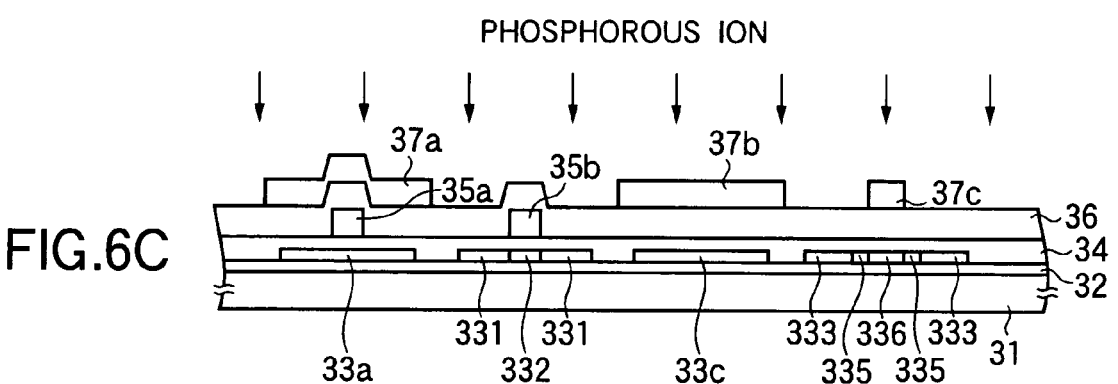
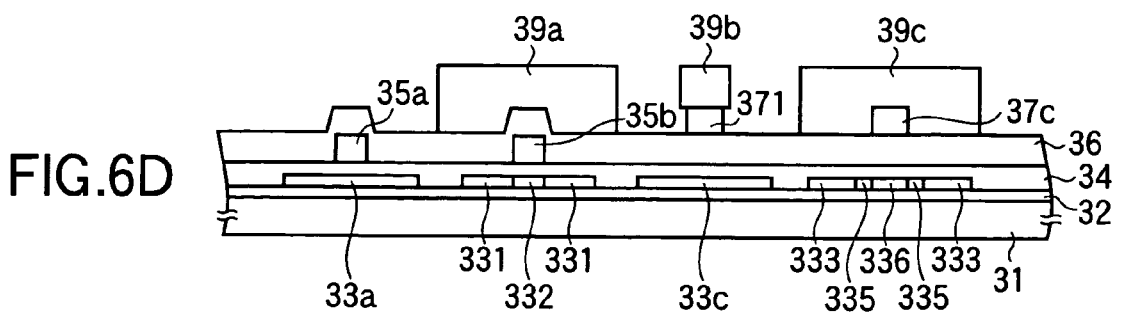

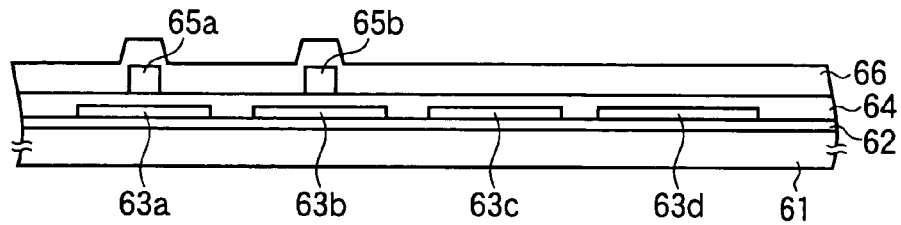
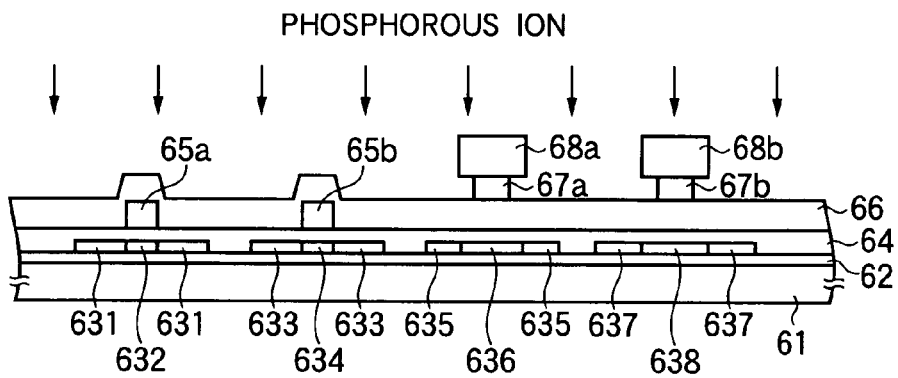
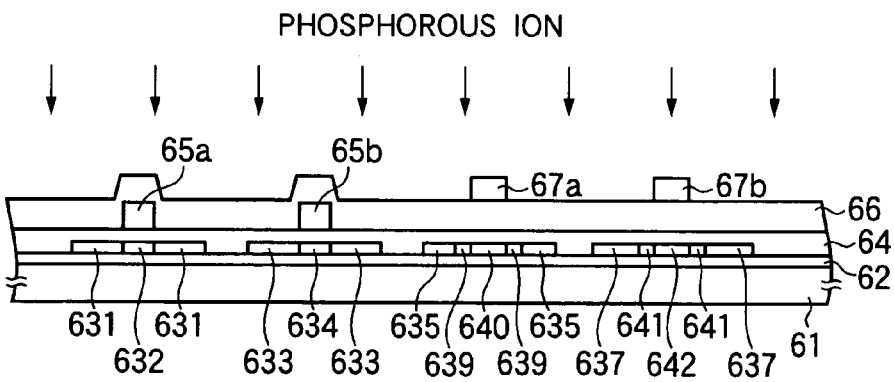

THIN FILM TRANSISTOR DEVICE AND METHOD OF MANUFACTURING THE SAME, THIN FILM TRANSISTOR SUBSTRATE AND DISPLAY HAVING THE SAME

BACKGROUND OF THE INVENTION

1. Field of the Invention

The present invention relates to a thin film transistor substrate (hereinafter also referred to as "TFT substrate") having thin film transistors (hereinafter also referred to as "TFTs") integrated thereon and a display having the same and, more particularly, to a TFT substrate on which TFTs utilizing semiconductor films made of polycrystalline silicon (polysilicon) or the like silicon are integrated and a display having the same.

2. Description of the Related Art

TFT substrates are used as substrates for driving active matrix liquid crystal display panels and EL (electroluminescence) display panels. Recently, polysilicon having high electron mobility is used for semiconductor layers to integrate not only TFTs for pixels but also a gate driver circuit and a data driver circuit that are peripheral circuits on the same substrate.

In such cases, driver circuits utilizing TFTs are normally constituted by complementary MOS (CMOS) transistors that are combinations of n-type and p-type transistors. The n-type TFTs are frequently formed with LDDs (lightly doped drains) that are low density impurity regions in order to suppress the degradation of characteristics due to the hot carrier phenomenon (hereinafter referred to as "hot carrier degradation") and the occurrence of an off leak current.

A description will now be made with reference to FIGS. 12A to 13C on a method of manufacturing TFTs of a TFT substrate to be used for a liquid crystal display panel (a first example of the related art) in which a driver circuit is constituted by CMOS transistors and in which an n-type TFT is provided with an LDD structure. In FIGS. 12A to 13C, an n-type TFT and a p-type TFT are shown on the left and right sides of the figures, respectively.

As shown in FIG. 12A, a $SiO_2$ film is first formed on a transparent insulated substrate 101 made of glass to a thickness of about 80 nm to provide a buffer layer 102. An amorphous silicon film is thereafter formed using plasma CVD, and the amorphous silicon is then crystallized by annealing it with an excimer laser to form a polysilicon semiconductor layer 103 having a thickness of about 50 nm. Next, the semiconductor layer 103 is patterned to form island-like semiconductor layers 103a and 103b. Then, a $SiO_2$ film is formed on the semiconductor layers 103a and 103b to a thickness of about 100 nm to provide a gate insulation film 104. Subsequently, a Cr film having a thickness of about 400 nm is formed and then patterned to provide gate electrodes 105a and 105b.

As shown in FIG. 12B, a resist is then applied and patterned to form a resist mask R106 such that it covers a region to become LDDs of the n-type TFT and the gate electrodes. Next, etching is performed using the resist mask R106 as an etching mask to form gate insulation films 104a and 104b. The gate insulation film 104a and the gate electrode 105a of the n-type TFT are formed like steps. Thereafter, the resist mask R106 is removed.

As shown in FIG. 12C, a resist is then applied and patterned to form a resist mask R107 such that it covers the p-type TFT as a whole. Next, an impurity such as phosphorus is implanted at low acceleration and in a high dose amount (that are 10 keV and $1 \times 10^{15}$ $cm^{-2}$, respectively, for example) using the resist mask R107, the gate electrode 105a and the gate insulation film 104a as masks to form source and drain regions 1031 of the n-type TFT in the semiconductor layer. Subsequently, an impurity such as phosphorus is implanted through the gate insulation film 104a at high acceleration and in a low dose amount (that are 90 KeV and $5 \times 10^{13}$ $cm^{-2}$, respectively, for example) using the resist mask R107 and the gate electrode 105a as masks to form LDD regions 1032. Referring to the first implantation of an impurity such as phosphorus, while the impurity must be implanted in the source and drain regions in a great amount, it is implanted at low acceleration and in a high dose amount because the gate insulation film 104a has been removed to leave no obstacle. Referring to the second implantation of an impurity such as phosphorus, while there is no need for implanting the impurity in a great amount because the purpose is to form LDDs, the implantation is performed at high acceleration and in a low dose amount because the impurity must be implanted through the gate insulation film 104a. The impurity such as phosphorus is not implanted in a channel region 1033 because the gate electrode 105a is used as a mask in both of the two rounds of implantation of the impurity such as phosphorus. There resist mask R107 is thereafter removed.

Next, as shown in FIG. 13A, a resist is applied and patterned to form a resist mask R108 such that it covers the n-type TFT as a whole. Next, an impurity such as boron is implanted with a predetermined acceleration energy and in a predetermined dose amount (that are 10 keV and $1 \times 10^{15}$ $cm^{-2}$, respectively, for example) using the resist mask R108 and the gate electrode 105b as masks to form source and drain regions 1035 of the p-type TFT in the semiconductor layer. Since the gate electrode 105b serves as a mask, the impurity such as boron is not implanted in a channel region 1036. The resist mask R108 is thereafter removed.

Next, as shown in FIG. 13B, the implanted impurities such as phosphorus and boron are activated by irradiating them with an excimer laser. While the source and drain regions 1031 of the n-type TFT and the source and drain regions 1035 of the p-type TFT are irradiated with laser light because there is no obstacle at all, it should be noted that the LDD regions 1032 are irradiated with laser light through the gate insulation film 104a.

Next, as shown in FIG. 13C, a SiN film is formed to a thickness of about 300 nm to provide a layer insulation film 109, and contact holes are provided in the layer insulation film 109. A Mo film is formed to a thickness of about 300 nm and patterned to provide wirings 110. Thus, then-type TFT and p-type TFT are completed. Although not shown, a protective film and pixel electrodes are formed to complete the TFT substrate.

In most cases, as shown in FIGS. 12A to 13C, the gate electrode 105a and the gate insulation film 104a of the n-type TFT are processed in the form of steps; implantation is performed at low acceleration and in a high dose amount using the gate electrode 105a and the gate insulation film 104a as masks to form the source and drain regions; and implantation is performed through the gate insulation film 104a at high acceleration and in a low dose amount using the gate electrode 105a as a mask to form the LDD regions. While FIGS. 12A to 13C show a structure in which the p-type TFT has no LDD region, the gate electrode 105b and the gate insulation film 104b of the p-type TFT may also be processed in the form of steps to form LDD regions.

A description will now be made with reference to FIGS. 14A to 15C on a method of manufacturing a TFT substrate to be used for a liquid crystal display panel (a second example of the related art) in which a single substrate is formed with TFTs for a low voltage capable of a high speed operation that constitute a part of a driver circuit, pixel TFTs for a high voltage for driving a liquid crystal, and a part of a driver circuit. FIGS. 14A to FIG. 15C illustrate a method of manufacturing an n-type TFT. In FIGS. 14A to 15C, a TFT for a low voltage and a TFT for a high voltage are shown on the left and right sides of the figures, respectively.

As shown in FIG. 14A, a $SiO_2$ film is first formed on a transparent insulated substrate 201 made of glass to a thickness of about 80 nm to provide a buffer layer 202. An amorphous silicon film is thereafter formed using plasma CVD, and the amorphous silicon is then crystallized by annealing it with an excimer laser to form a polysilicon semiconductor layer 203 having a thickness of about 50 nm. Next, the semiconductor layer 203 is patterned to form island-like semiconductor layers 203a and 203b.

As shown in FIG. 14B, a $SiO_2$ film is then formed on the semiconductor layers 203a and 203b to a thickness of about 30 nm to provide a gate insulation film 204 for the TFT for a low voltage. Subsequently, a Cr film is formed to a thickness of about 400 nm and patterned to provide a gate electrode 205a and a gate insulation film 204a of the TFT for a low voltage. Thus, the gate insulation film 204a and the gate electrode 205a are formed only on the TFT for a low voltage.

Next, as shown in FIG. 14C, a $SiO_2$ film is formed throughout the substrate to a thickness of about 100 nm to provide a gate insulation film 206 of the TFT for a high voltage. Next, a Cr film is formed to a thickness of about 400 nm and patterned to provide a gate electrode 207b of the TFT for a high voltage. Thus, the TFT for a high voltage is formed with the gate electrode 207b. The thickness of the gate insulation film 204a of the TFT for a low voltage is relatively small, and the thickness of the gate insulation film 206 of the TFT for a high voltage is relatively great.

Next, a resist is then applied and patterned to form a resist mask. The gate insulation film 206 is then etched using the resist mask as an etching mask as shown in FIG. 15A. The gate insulation film 206 is etched such that it becomes wider than the gate electrode 207b of the TFT for a high voltage and such that it is left only in the region of the TFT for a high voltage. The resist mask is thereafter removed. At this stage, the gate electrode 207b and the gate insulation film 206b are formed like steps at the TFT for a high voltage.

Next, an impurity such as phosphorous is implanted at low acceleration and in a high dose amount (that are 10 keV and $1\times10^{15}$ cm$^{-2}$, respectively, for example) using the gate electrode 205a, the gate electrode 207b and the gate insulation film 206b as masks to form source and drain regions 2031 of the TFT for a low voltage and source and drain regions 2035 of the TFT for a high voltage. Subsequently, an impurity such as phosphorous is implanted through the gate insulation film 206b into the semiconductor layer 203b at high acceleration and in a low dose amount (that are 90 keV and $5\times10^{13}$ cm$^{-2}$, respectively, for example) using the gate electrode 205a and the gate electrode 207b as masks to form LDD regions 2036 of the TFT for a high voltage.

While the source and drain regions must be doped with a great amount of impurity at the first implantation of an impurity such as phosphorous, implantation is performed at low acceleration and in a high dose amount because the gate insulation film 206 has been removed to leave no obstacle. On the contrary, while there is no need to implant a great amount of impurity at the second implantation of an impurity such as phosphorous because LDDs are to be formed, implantation is performed at high acceleration and in a low dose amount because the implantation must be performed through the gate insulation film 206b. Since the gate electrodes 205a and 207b are used as masks at both of the two rounds of implantation of the impurity such as phosphorous, the impurity such as phosphorous is not implanted in the channel regions 2032 and 2037.

Although not shown in FIGS. 14A to 15C, since the peripheral circuits such as the drivers are normally constituted by CMOS transistors, it is necessary to implant an impurity such as phosphorous into TFTs (including pixel TFTs) to become n-type TFTs after covering TFT to become p-type TFTs with a resist mask and to implant an impurity such as boron in the TFTs to become p-type TFTs after covering the TFT to become n-type TFTs with a resist mask.

Next, as shown in FIG. 15B, the implanted impurities such as phosphorous and boron are activated by irradiating them with an excimer laser. While the source and drain regions 2031 of the TFT for a low voltage and the source and drain regions 2035 of the TFT for a high voltage are directly irradiated with laser light because there is no obstacle at all, it should be noted that the LDD regions 2036 are irradiated with laser light through the gate insulation film 206b.

Next, as shown in FIG. 15C, a SiN film is formed to a thickness of about 300 nm to provide a layer insulation film 208, and contact holes are provided in the layer insulation film 208. A Mo film is formed to a thickness of about 300 nm and patterned to provide wirings 209. Thus, the TFT for a low voltage and the TFT for a high voltage are completed. Although not shown, a protective film and pixel electrodes are formed further to complete the TFT substrate.

As thus described, in the TFT for a high voltage, the gate insulation film 206b wider than the gate electrode 207b is provided on the semiconductor layer 203b to form a stepped structure similar to that in the first example of the related art. The LDD regions 2036 are thus formed. In the TFT for a low voltage, since the gate electrode 205a and the gate insulation film 204a have the same width, no LDD region is formed.

JP-A-2001-168346 has disclosed a technique in which an impurity is implanted twice to provide an LDD structure and in which the dimensions of a gate electrode to be used as a mask are changed between the first and second rounds of implantation depending on the length of the LDD. Metal oxidation or dry etching is used to change the dimensions of the gate electrode used as a mask, and an elaborate photoresist is provided to allow the gate electrode to be dry-etched with high accuracy. However, the use of such a technique results in a problem in that it is not easy to control the length of the LDD because no mask is used to change the dimensions of the gate electrode.

JP-A-2000-36598 has disclosed a technique in which TFTs having different LDD structures are simultaneously fabricated on the same substrate. According to the publication, a highly heat resistant Ta film or a Ta-based film is used as a wiring material which is further covered by a protective layer. This allows a heating process at a high temperature, and the protective film is used as an etching stopper to provide TFTs having LDD structures formed by a self-aligning process utilizing sidewalls in the section of peripheral circuits and to provide TFTs having LDD structures formed by a non-self-aligning process utilizing an insulator in the section of a pixel matrix. In addition to the above-cited technical disclosure, the publication points out a need for etching a gate insulation film because of a need for forming the gate insulation film on the entire surface with a small thickness that is adapted to the peripheral driving circuit section prior to the formation of gate electrodes and for forming the gate insulation film again such that it has a greater thickness in the pixel matrix section. Since the gate insulation film is subjected to anisotropic etching after forming an insulation film on the gate electrodes and covering regions of the pixel matrix section with a resist to become LDDs, LDDs having a great LDD length are formed in the pixel matrix section using mask registration, and LDDs that are self-aligned using sidewalls are formed in the circuit section. However, it is not possible to form TFTs having no LDD selectively.

Further, JP-A-9-191111 has disclosed a method of fabricating a semiconductor device, characterized in that it has a step of integrally fabricating an n-channel type thin film transistor and a p-channel type thin film transistor on the same substrate, a porous anodic oxide film being selectively formed on a side of a gate electrode made of a material that can be anodized at the same step, a step of adding an impurity that imparts n-type properties using the anodic oxide film as a mask, a step of removing the anodic oxide film, a step of adding an impurity that imparts n-type properties using the gate electrode as a mask to form an LDD region under the region where the anodic oxide film has existed and a step of adding an impurity that imparts p-type properties while masking the region to become the n-channel type thin film transistor selectively. According to the technique in the publication, it is necessary to anodize the gate electrode. Further, all TFTs are formed with LDDs having the same length, and it is not possible to form n-type TFTs having no LDD selectively.

As described above with reference to the first example of the related art, according to methods of manufacturing a TFT substrate in which LDD are formed by forming a semiconductor layer and a gate insulation film in the form of steps, an entire surface of a TFT substrate is frequently irradiated with an excimer laser to activate an impurity that has been introduced therein at a low temperature. While the gate insulation film 104a is formed on the LDD regions 1032, no gate insulation film is formed on the source and drain regions 1031 and 1035. Therefore, energy that is actually absorbed by the LDD regions 1032 is different from that absorbed by the source and drain regions 1031 and 1035 because of the effect of optical interference, which results in a problem in that it is not easy to optimize energy for activation. Further, the improvement of TFT performance has resulted in a trend toward thinner gate insulation films. When the gate insulation film 104a becomes thinner, it becomes less capable of masking impurity ions when the source and drain regions 1031 and 1035 are doped with the impurity. Thus, a part of impurity ions are implanted in the LDD regions 1032 too, which results in a problem in that it becomes difficult to control the density of the impurity in the LDD regions 1032 to achieve a low density.

The method of manufacturing a TFT substrate as described with reference to the second example of the related art has the following problems in addition to the problems with the first example of the related art. The gate insulation film 204 for the TFT for a low voltage is once formed on the semiconductor layer 203b for the TFT for a high voltage, and the gate insulation film 204 is thereafter removed through etching. Since the etching is normally dry etching, the semiconductor layer 203b of the TFT for a high voltage is very much vulnerable to plasma damage attributable to the etching. This results in a problem in that the characteristics and reliability of the TFT for a high voltage are degraded. Referring to the TFT for a low voltage, since the gate electrode 205a and the gate insulation film 204a have the same width, a leak current is likely to flow between the gate electrode 205a and the semiconductor layer 203a (the source and drain regions 2031 and the channel region 2032) because of a small amount of impurity or contaminated ions that are left on a sidewall of the gate insulation film 204a at manufacturing processes. In addition, this tendency is more significant for the TFT for a low voltage because the gate insulation film 204a of the same has a smaller thickness. This results in a problem in that the reliability of the TFT for a low voltage is also reduced.

Further, in order to load circuits having higher functions on a TFT substrate integral with peripheral circuits in the future, elements may be made finer by reducing their channel lengths to increase the operating speeds of a logic circuit section and a signal processing circuit section, and LDDs may be eliminated even from n-type TFTs. For this purpose, a lower operating voltage must be achieved by making the thickness of gate insulation films of TFTs of the logic circuit section and the signal processing circuit section smaller compared to that in pixel TFTs which require a somewhat high voltage (in the range from 10 V to 30 V, for example) to achieve liquid crystal or EL driving or that in a part of a driver circuit that directly drives the pixel TFTs. The reason is that a reduction of the thickness of a gate insulation film allows a threshold voltage and hence an operating voltage to be decreased and that degradation attributable to hot carriers can therefore be suppressed without increasing a channel length or forming LDDs.

SUMMARY OF THE INVENTION

It is an object of the invention to provide a thin film transistor device having good characteristics and high reliability, a method of manufacturing the same, and a thin film transistor substrate and a display having the same.

The above object is achieved by a method of manufacturing a thin film transistor device, characterized in that it has the steps of forming a semiconductor layer having a predetermined configuration on a substrate, forming a gate insulation film on the semiconductor layer, forming a metal thin film on the gate insulation film, patterning the metal thin film so as to remove the metal thin film on the semiconductor layer in regions to become source and drain regions of a thin film transistor of a first conductivity type, forming the source and drain regions of the thin film transistor of the first conductivity type by implanting an impurity of the first conductivity type in the semiconductor layer using the patterned metal thin film as a mask, forming a gate electrode of the thin film transistor of the first conductivity type by patterning the patterned metal thin film further, and forming a low density impurity region between the source and drain regions and a channel region of the thin film transistor of the first conductivity type by implanting an impurity of the first conductivity type in the semiconductor layer using the gate electrode of the thin film transistor of the first conductivity type as a mask.

BRIEF DESCRIPTION OF THE DRAWINGS

FIG. 1 shows a configuration of a liquid crystal display in a mode for carrying out the invention;

FIGS. 2A to 2C are sectional views taken in processes showing a configuration of a TFT substrate and a method of manufacturing the same according to Embodiment 1 in the mode of carrying out the invention;

FIGS. 3A to 3C are sectional views taken in processes showing the configuration of the TFT substrate and the method of manufacturing the same according to Embodiment 1 in the mode of carrying out the invention;

FIGS. 5A to 5C are sectional views taken in processes showing the configuration of the TFT substrate and the method of manufacturing the same according to Embodiment 2 in the mode of carrying out the invention;

FIGS. 6A to 6D are sectional views taken in processes showing a configuration of a TFT substrate and a method of manufacturing the same according to Embodiment 3 in the mode of carrying out the invention;

FIGS. 10A to 10C are sectional views taken in processes showing a configuration of a TFT substrate and a method of manufacturing the same according to Embodiment 5 in the mode of carrying out the invention;

DESCRIPTION OF THE PREFERRED EMBODIMENTS

Figure 4A:
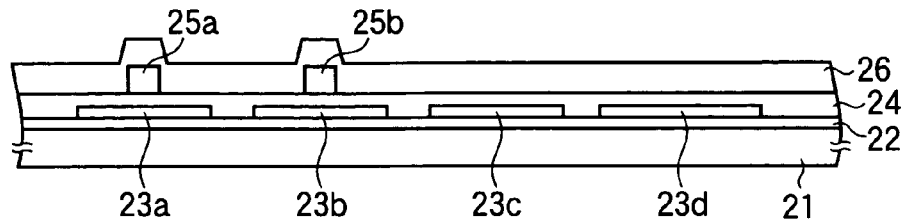
FIGS. 4A to 4C are sectional views taken in processes showing a configuration of a TFT substrate and a method of manufacturing the same according to Embodiment 2 in the mode of carrying out the invention.

A description will now be made with reference to FIGS. 1 to 11C on a thin film transistor device, a method of manufacturing the same, and a thin film transistor substrate and a liquid crystal display as a display having the same in a mode for carrying out the invention. FIG. 1 shows a configuration of a TFT substrate that forms a part of a liquid crystal display in the present mode for carrying out the invention. A liquid crystal display 1000 has a TFT substrate 1100, an opposite substrate (not shown) provided opposite to the TFT substrate 1100 and a liquid crystal sealed between the substrates. The TFT substrate 1100 includes a pixel matrix section 1110 in which pixel regions are provided in the form of a matrix and includes a gate driver 1120, a display controller 1140 and a data driver 1130 that are peripheral circuits. A plurality of pixel TFTs are formed at respective pixel regions of the pixel matrix section 1110. Each of the pixel TFTs is connected to the data driver 1130 through a data line connected to a source electrode of the pixel TFT and is connected to the gate driver 1120 through a gate line connected to a gate of the pixel TFT.

A horizontal synchronization signal H, a vertical synchronization signal V, a low power supply voltage VL and a ground voltage Vgnd are supplied to the display controller 1140 from a personal computer (not shown), for example. The display controller 1140 generates a D-SI signal and a D-CLK signal using the supplied signals and outputs them to a shift register 1131 of the data driver 1130. The low power supply voltage VL and the ground voltage Vgnd are also supplied to the data driver 1130. A high power supply voltage VH is also supplied to the data driver 1130. The shift register 1131 of the data driver 1130 outputs the generated signals to a level shifter 1132. Red (R), green (G) and blue (B) signals are input to an analog switch 1133 of the data driver 1130 from the personal computer, for example. The analog switch 1133 outputs the signals to each of the data lines connected to the pixel matrix section 1110 in accordance with the signals from the level shifter 1132.

The display controller 1140 generates a G-SI signal and a G-CLK signal using the signals supplied thereto and outputs them to a shift register 1121 of the gate driver 1120. The low power supply voltage VL and the ground voltage Vgnd are also supplied to the gate driver 1120. The high power supply voltage VH is also supplied to the gate driver 1120. The shift register 1121 of the gate driver 1120 outputs the generated signals to a level shifter 1122. The level shifter 1122 outputs signals to an output buffer 1123 based on the input signals. The output buffer 1123 outputs a signal to each of the gate lines connected to the pixel matrix section 1110 based on the input signals.

The display controller 1140, the shift register 1131 of the data driver 1130 and the shift register 1121 of the gate driver 1120 are constituted by TFTs for a low voltage because they must operate at a high speed. The level shifter 1132 of the data driver 1130 and the level shifter 1122 of the gate driver 1120 are constituted by both of TFTs for a low voltage and TFTs for a high voltage. The output buffer 1123 of the gate driver 1120, the analog switch 1133 of the data driver 1130 and the pixel matrix section 1110 are constituted by TFTs for a high voltage that operate at a low speed.

Embodiment 1 described below can be applied to both of TFTs for a low voltage and TFTs for a high voltage. The embodiment can accommodate TFTs for a low voltage whether or not they are configured with LDDs. Embodiments 2 to 5 described below represent cases in which TFTs for a low voltage and TFTs for a high voltage are configured at the same time. In the TFTs for a low voltage, no LDD is provided, and a gate insulation film is constituted by a single layer having a thin thickness. In the TFTs for a high voltage, LDDs are provided, and a gate insulation film has two layers to provide a configuration having a high withstand voltage.

Embodiment 1

A method of manufacturing a TFT substrate according to Embodiment 1 in the present mode for carrying out the invention will now be described with reference to FIGS. 2A to 3C. FIGS. 2A to 3C are sectional views taken in processes showing a configuration of a TFT substrate and a method of manufacturing the same. In FIGS. 2A to 3C, examples of a p-type TFT formed with no LDD, an n-type TFT formed with LDDs and an n-type TFT formed with no LDD are shown in the same order starting with the TFT on the left in the figures.

First, as shown in FIG. 2A, a SiO$_2$ film is formed to a thickness of about 80 nm on a transparent insulated substrate 1 made of glass to provide a buffer layer 2. Next, an amorphous silicon film is formed using plasma CVD and then annealed using an excimer laser to crystallize the amorphous silicon, thereby forming a polysilicon semiconductor layer 3 having a thickness of about 50 nm. Next, a resist is applied and patterned to form a resist mask. Dry etching is then performed using the resist mask as an etching mask to form semiconductor layers 3a, 3b and 3c in the form of islands. Next, a SiO$_2$ film is formed on the semiconductor layers 3a, 3b and 3c to a thickness of about 100 nm to provide a gate insulation film 4.

A Mo film is then formed to a thickness of about 300 nm to provide a metal thin film. Next, a resist is applied and patterned to form a resist mask. Next, as shown in FIG. 2B, dry etching is performed using the resist mask as an etching mask to remove parts of the metal thin film that are associated with source and drain regions 301 of the n-type TFTs. That is, for the p-type TFT to be formed with no LDD, the metal thin film is patterned to leave a part 5a of the metal thin film having a width equal to or wider than the width of the p-type TFT as a whole. For the n-type TFT to be formed with LDDs, the metal thin film is patterned to leave a part 5b of the same associated with a channel region and LDD regions. For the n-type TFT to be formed with no LDD, it is patterned to leave a gate electrode 5c itself. For the n-type TFT to be formed with LDDs, the width of the part 5b of the metal thin film is wider than the gate width by an amount to accommodate the LDD regions. The resist mask is thereafter removed.

Next, first doping is performed by implanting an n-type impurity such as phosphorous through the gate insulation film 4 at high acceleration and in a high dose amount (that are 90 keV and 1×10$^{15}$ cm$^{-2}$, respectively, for example) using the remaining parts 5a, 5b and 5c of the metal thin film as masks. Thus, the source and drain regions 301 of the n-type TFT to be formed with LDDs and the n-type TFT to be formed with no LDD are formed. Since the parts 5b and 5c of the metal thin film serve as masks, no impurity is implanted in a part 302 to become LDD regions and a channel region of the n-type TFT to be formed with LDDs, and no impurity is implanted in a channel region 303 of the n-type TFT to be formed with no LDD. Since the part 5a of the metal thin film serves as a mask, no impurity is implanted in the semiconductor layer 3a of the p-type TFT.

A resist is then applied and patterned to form a resist mask. Next, as shown in FIG. 2C, etching is performed using the resist mask as an etching mask to remove parts of the metal thin film of made of Mo that are associated with source and drain regions of the p-type TFT and parts associated with the LDD regions of then-type TFT. Specifically, the metal thin film is patterned to leave a gate electrode 51 of the p-type TFT, a gate electrode 52 of the n-type TFT to be formed with LDDs and the gate electrode 5c of the n-type TFT to be formed with no LDD. The width of the metal thin film of the n-type TFT to be formed with LDDs is reduced to accommodate LDD regions. Referring to the n-type TFT to be formed with no LDD, since the gate electrode 5c has already been formed, it is only required to cover the n-type TFT as a whole with the resist mask. The resist mask is thereafter removed.

Second doping is then performed by implanting an n-type impurity such as phosphorous through the gate insulation film 4 using the gate electrodes 51, 52 and 5c of the respective TFTs as masks at high acceleration and in a low dose amount (that are 90 keV and 5×10$^{13}$ cm$^{-2}$, respectively, for example). Thus, LDD regions 306 are formed between the source or drain region 301 and the channel region 307 in the semiconductor layer 3b of the n-type TFT to be formed with LDD regions. At this time, the impurity is implanted again in the source and drain regions 301 of the n-type TFT to be formed with LDDs and the n-type TFT to be formed with no LDD, but this creates no problem. The n-type impurity is also implanted in the source and drain regions 304 of the p-type TFT at high acceleration and in a low dose amount.

Next, as shown in FIG. 3A, a resist is applied and patterned to form resist masks 6a and 6b such that they cover the n-type TFTs as a whole. Thus, no p-type impurity will be implanted in the n-type TFTs. Specifically, a p-type impurity such as boron is selectively implanted only in the p-type TFT through the gate insulation film 4 using the gate electrode 51 of the p-type TFT as a mask at high acceleration and in a high dose amount (that are 70 KeV and 1×10$^{15}$ cm$^{-2}$, respectively, for example). Thus, the source and drain regions 304 in the semiconductor layer 3a of the p-type TFT are formed. It is required to implant the impurity only once because no LDD region is to be formed on the p-type TFT of the present embodiment. The p-type impurity such as boron is not implanted in the channel region 305 of the p-type TFT. The resist masks 6a and 6b are thereafter removed.

Next, as shown in FIG. 3B, annealing is performed through a thermal process at about 500° C. or using an excimer laser to activate the n-type and p-type impurities.

Next, as shown in FIG. 3C, a SiN film is formed to a thickness of about 300 nm to provide a layer insulation film 7, and contact holes are provided in the layer insulation film 7 and the gate insulation film 4. Further, an Al film is formed to a thickness of about 300 nm and patterned to provide wirings 8. Thus, the n-type TFTs and the p-type TFT are completed. Although not shown, a protective film and pixel electrodes are formed to complete the TFT substrate.

The implantation of the n-type impurity to form LDD regions shown in FIG. 2C may be performed after the resist masks 6a and 6b shown in FIG. 3A are peeled off and before the step of irradiating with laser light shown in FIG. 3B.

In the present embodiment, when the n-type impurity is introduced to form the source and drain regions 301 of the n-type TFT, the metal thin film 5 made of Mo to become the gate electrode is formed with a great width to accommodate the width of the LDD regions 306. When the LDD regions 306 are formed, the metal thin film 5 is shaped to the width of the gate electrode. As a result, the LDD regions can be formed without using a structure in the form of steps formed by a semiconductor film and a gate insulation film as in the example of the related art. Further, this makes it possible to optimize energy for activating the impurity even when it is activated by irradiating the same with laser light because there is no region that is not covered by the gate insulation film 4. Since the gate insulation film 4 is not etched except the regions of contact holes, a leak current is unlikely to be generated between the gate electrodes and the source and drain regions. Further, since the metal thin films serve as masks when the impurity is implanted in the source and drain regions 301, the problem of a reduction in masking performance will not occur even when the gate insulation film 4 is thin.

Although an n-type impurity is implanted in the source and drain regions 304 of the p-type TFT when the n-type impurity is implanted in the LDD regions 306 in FIG. 2C, it has substantially negligible influence because the amount introduced is not more than one-tenth the amount of the p-type impurity implanted in the source and drain regions 304 of the p-type TFT in FIG. 3A. It is therefore possible to facilitate activation of the impurity and control of the impurity in the LDD regions without increasing manufacturing process, which allows device characteristics to be improved.

Further, the p-type TFT is formed with no LDD in the present embodiment. There is no need for forming LDDs at the p-type TFT for which degradation attributable to hot carriers is not a serious concern, and it is rather preferable to form no LDD in order to improve the driving capability of the same.

Embodiment 2

A description will now be made with reference to FIGS. 4A to 5C on a method of manufacturing a TFT substrate according to Embodiment 2 in the present mode for carrying out the invention. In the present embodiment, a p-type TFT for a low voltage, an n-type TFT for a low voltage, a p-type TFT for a high voltage and an n-type TFT for a high voltage are simultaneously formed. FIGS. 4A to 5C are sectional views taken in processes showing a configuration of a TFT substrate and a method of manufacturing the same. In FIGS. 4A to 5C, a p-type TFT for a low voltage, an n-type TFT for a low voltage, a p-type TFT for a high voltage and an n-type TFT for a high voltage are shown in the order listed starting with the TFT on the left side of the figures.

First, as shown in FIG. 4A, a $SiO_2$ film is formed to a thickness of about 80 nm on a transparent insulated substrate 21 made of glass to provide a buffer layer 22. Next, an amorphous silicon film is formed using plasma CVD and is annealed with an excimer laser to crystallize the amorphous silicon, thereby forming a polysilicon semiconductor layer 23 having a thickness of about 50 nm. A resist is then applied and patterned to form a resist mask. Dry etching is performed using the resist mask as an etching mask to form semiconductor layers 23a, 23b, 23c and 23d in the form of islands. Next, a $SiO_2$ film is formed to a thickness of about 30 nm on the semiconductor layers 23a, 23b, 23c and 23d to provide a first gate insulation film 24. The first gate insulation film 24 serves as a gate insulation film for the TFTs for a low voltage.

Next, a Mo film is formed to a thickness of about 300 nm to provide a metal thin film. A resist is then applied and patterned to form a resist mask. Etching is performed using the resist mask as an etching mask to remove parts of the metal thin film associated with source and drain regions of the p-type TFT for a low voltage and the n-type TFT for a low voltage and parts associated with the p-type TFT for a high voltage and the n-type TFT for a high voltage. That is, the metal thin film is patterned to leave a gate electrode 25a of the p-type TFT for a low voltage and a gate electrode 25b of the n-type TFT for a low voltage. Next, a $SiO_2$ film is formed to a thickness of about 70 nm on the gate electrodes 25a and 25b to provide a second gate insulation film 26. Since the first gate insulation film 24 is a gate insulation film for the TFTs for a low voltage, the thickness of the same may be determined in accordance with the TFTs for a low voltage. Since the two gate insulation films, i.e., the first gate insulation film 24 and the second gate insulation film 26 constitute a gate insulation film for the TFTs for a high voltage, the thickness of the gate insulation film may be determined in accordance with the TFTs for a high voltage by adjusting the thickness of the second gate insulation film 26.

Figure 4B:
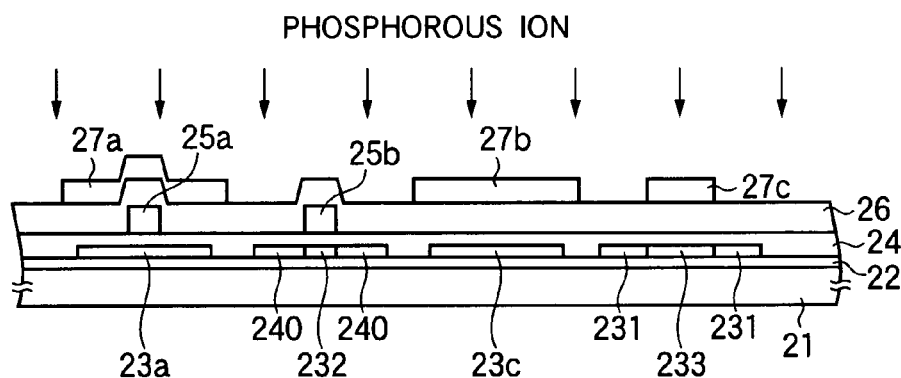

Next, as shown in FIG. 4B, an Al film to become gate electrodes of the TFTs for a high voltage is formed to a thickness of about 300 nm to provide a metal thin film. A resist is then applied and patterned to form a resist mask. Etching is performed using the resist mask as an etching mask to remove parts of the metal thin film associated with the n-type TFTs for a low voltage and parts of the same associated with source and drain regions 231 of the n-type TFTs for a high voltage. That is, the metal thin film is patterned to leave a part 27a of the metal thin film having a width equal to or wider than the entire width of the p-type TFT for a low voltage, a part 27b of the metal thin film having a width equal to or wider than the entire width of the p-type TFT for a high voltage, and a part 27c of the metal thin film associated with a channel region and LDD regions of the n-type TFT for a high voltage. Since the n-type TFT for a high voltage is to be provided with LDD regions, the width of part 27c of the metal thin film is wider than a gate width of the same by an amount to accommodate the LDD regions. The resist mask is thereafter removed.

First doping is then performed by implanting an n-type impurity such as phosphorous through the gate insulation films 24 and 26 at high acceleration and in a high dose amount (that are 90 keV and $1 \times 10^{15}$ $cm^{-2}$, respectively, for example) using the remaining parts 27a, 27b and 27c of the metal thin film made of Al as masks. Thus, source and drain regions 240 of the n-type TFT for a low voltage and source and drain regions 231 of the n-type TFT for a high voltage are formed. Since the parts 27a, 27b and 27c of the metal thin film serve as masks, no impurity is implanted in the semiconductor layer 23a of the p-type TFT for a low voltage, the semiconductor layer 23c of the p-type TFT for a high voltage and a part 233 to become the LDD regions and the channel region of the n-type TFT for a high voltage. Further, since the gate electrode 25b serves as a mask, the impurity is not implanted in a channel 232 of the n-type TFT for a low voltage.

A resist is then applied and patterned to form a resist mask. Next, etching is performed using the resist mask as an etching mask to remove the part 27a of the metal thin film associated with the p-type TFT for a low voltage, a part of the same associated with source and drain regions 236 of the p-type TFT for a high voltage and a part of the same associated with LDD regions 238 of the n-type TFT for a high voltage. That is, the metal thin film is patterned to leave a gate electrode 271 of the p-type TFT for a high voltage and a gate electrode 272 of the n-type TFT for a high voltage. The resist mask is thereafter removed.

Figure 4C:
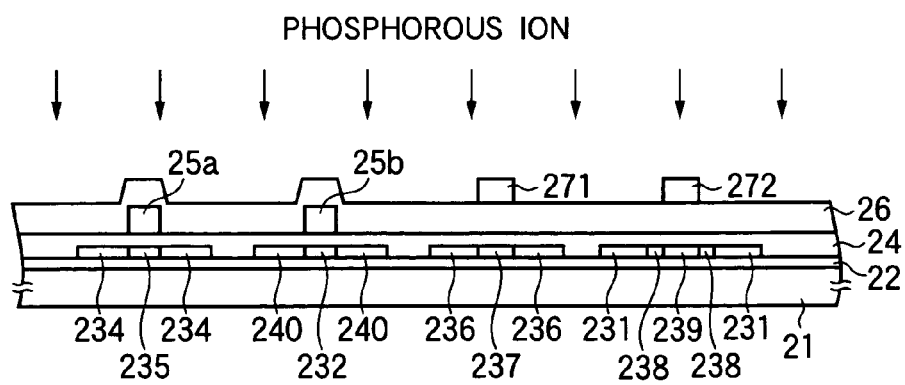

Next, as shown in FIG. 4C, second doping is performed by implanting an n-type impurity such as phosphorous through the gate insulation films 24 and 26 at high acceleration and in a low dose amount (that are 90 keV and $5 \times 10^{13}$ $cm^{-2}$, respectively, for example) using the gate electrode 271 of the p-type TFT for a high voltage and the gate electrode 272 of the n-type TFT for a high voltage as masks. Thus, LDD regions 238 are formed in the semiconductor layer between the source or drain regions 231 and a channel region 239 of the n-type TFT for a high voltage. An n-type impurity is also implanted at high acceleration and in a low dose amount in source and drain regions 234 of the p-type TFT for a low voltage and source and drain regions 236 of the p-type TFT for a high voltage. The n-type impurity is not implanted in a channel region 237 of the p-type TFT for a high voltage and the channel region 239 of the n-type TFT for a high voltage because the gate electrodes 271 and 272 serve as masks. The gate electrode 25a of the p-type TFT for a low voltage and the gate electrode 25b of the n-type TFT for a low voltage also serve as masks to prevent the n-type impurity from being implanted in channel regions 235 and 232.

Next, as shown in FIG. 5A, a resist is applied and patterned to form resist masks 28a and 28b such that they cover the n-type TFT for a low voltage and the n-type TFT for a high voltage as a whole. Thus, the p-type impurity is not introduced into the n-type TFT for a low voltage and the n-type TFT for a high voltage. Specifically, a p-type impurity such as boron is selectively implanted only in the p-type TFT for a high voltage and the p-type TFT for a low voltage through the gate insulation films 24 and 26 at high acceleration and in a high dose amount (that are 70 keV and $1 \times 10^{15}$ cm$^{-2}$, respectively, for example) using the gate electrode 25a of the p-type TFT for a low voltage and the gate electrode 271 of the p-type TFT for a high voltage as masks. Thus, the source and drain regions 234 in the semiconductor layer of the p-type TFT for a low voltage and the source and drain regions 236 in the semiconductor layer of the p-type TFT for a high voltage are formed. Since the p-type TFTs are to be formed with no LDD region, it is required to implant the impurity in them only once.

The resist masks 28a and 28b are thereafter peeled off. As shown in FIG. 5B, annealing is then performed through a thermal process at about 500° C. or using an excimer laser to activate the n-type and p-type impurities.

Next, as shown in FIG. 5C, a SiN film is formed to a thickness of about 300 nm to provide a layer insulation film 29, and contact holes are provided in the layer insulation film 29 and the gate insulation films 24 and 26. An Al film is formed to a thickness of about 300 nm and is patterned to provide wirings 30. This completes the n-type TFT for a low voltage, the p-type TFT for a low voltage, the n-type TFT for a high voltage and the p-type TFT for a high voltage. Although not shown, a protective film and pixel electrodes are formed further to complete the TFT substrate.

The p-type TFT for a low voltage on the TFT substrate according to the present embodiment is constituted by the buffer layer 22, the semiconductor layer 23 including the p-type source and drain regions 234 and the channel region 235, the first gate insulation film 24, the gate electrode 25a formed on the channel region 235, the second gate insulation film 26, the layer insulation film 29 and the wirings 30 that are provided in the layer insulation film 29 and the first and second gate insulation films 24 and 26 and that are connected to contact holes for connecting the source and drain regions 234, those elements being formed in the order listed on the transparent insulated substrate 21. The n-type TFT for a low voltage is constituted by the buffer layer 22, the semiconductor layer 23 including the n-type source and drain regions 240 and the channel region 232, the first gate insulation film 24, the gate electrode 25b formed on the channel region 232, the second gate insulation film 26, the layer insulation film 29 and the wirings 30 that are provided in the layer insulation film 29 and the first and second gate insulation films 24 and 26 and that are connected to contact holes for connecting the source and drain regions 240, those elements being formed in the order listed on the transparent insulated substrate 21.

The p-type TFT for a high voltage is constituted by the buffer layer 22, the semiconductor layer 23 including the p-type source and drain regions 236 and the channel region 237, the first gate insulation film 24, the second gate insulation film 26, the gate electrode 271 formed on the channel region 237, the layer insulation film 29 and the wirings 30 that are provided in the layer insulation film 29 and the first and second gate insulation films 24 and 26 and that are connected to contact holes for connecting the source and drain regions 236, those elements being formed in the order listed on the transparent insulated substrate 21. The n-type TFT for a high voltage is constituted by the buffer layer 22, the semiconductor layer 23 including the n-type source and drain regions 231, the LDD regions 238 and the channel region 239, the first gate insulation film 24, the second gate insulation film 26, the gate electrode 272 formed on the channel region 239, the layer insulation film 29 and the wirings 30 that are provided in the layer insulation film 29 and the first and second gate insulation films 24 and 26 and that are connected to contact holes for connecting the source and drain regions 231, those elements being formed in the order listed on the transparent insulated substrate 21.

The implantation of the n-type impurity for forming the LDD regions shown in FIG. 4C may be performed after peeling off the resist masks 28a and 28b as shown in FIG. 5A and before the step of irradiating with laser light shown in FIG. 5B. For some n-type TFTs for a high voltage, the first implantation of the n-type impurity may be performed after forming the parts 27c of the metal thin film shown in FIG. 4B on the gate electrodes in advance, and a resist mask to cover the gate electrodes 272 of such n-type TFTs for a high voltage may be formed at the step of forming the gate electrodes 271 and 272 shown in FIG. 4C. Since this prevents etching, n-type TFTs for a high voltage having no LDD region can be formed even when the second implantation of the n-type impurity is performed after peeling of f the resist mask.

In the present embodiment, two gate insulation films are formed. The gate insulation films of the TFTs for a low voltage are constituted by a single layer, i.e., the gate insulation film 24, and the gate insulation films for the TFT for a high voltage are constituted by two layers, i.e., the gate insulation films 24 and 26. Since the TFTs for a high voltage and the TFTs for a low voltage are manufactured without dry-etching their gate insulation films, it is possible to avoid plasma damage that otherwise occurs on the semiconductor layers when the gate insulation films are dry-etched. Since the gate insulation films 24 of the TFTs for a low voltage are formed throughout the substrate, it is possible to prevent any leak current between the gate electrodes 25a and 25b and the semiconductor layers. The metal thin film 27c of the n-type TFT for a high voltage is formed wider than the gate electrode 272 by an amount to accommodate the width of the LDD regions 238 when the n-type impurity is first implanted, and it is shaped into the gate electrode 272 that has a proper gate width at the second implantation of the n-type impurity. Since this makes it possible to form the LDD regions without using a stepped structure defined by the semiconductor layer and the gate insulation film, the problems with the related art can be resolved. According to the present embodiment, the TFTs for a high voltage have a thick gate insulation film and an LDD structure, and the TFTs for a low voltage have a thin gate insulation film and no LDD structure, which makes it possible to provide both of TFTs having a high withstand voltage and TFTs having a high speed at the same time.

In the present embodiment, the p-type TFTs are formed with no LDD. Since degradation attributable to hot carriers is not a so serious concern for p-type TFTs, there is no particular need for forming LDDs, and it is rather preferable to form no LDD in order to improve driving capability.

Embodiment 3

Next, a description will now be made with reference to FIGS. 6A to 7C on a method of manufacturing a TFT substrate according to Embodiment 3 in the present mode for carrying out the invention as a modification of Embodiment 2. FIGS. 6A to 7C are sectional views taken in processes showing a configuration of a TFT substrate and a method of manufacturing the same. In FIGS. 6A to 7C, a p-type TFT for a low voltage, an n-type TFT for a low voltage, a p-type TFT for a high voltage and an n-type TFT for a high voltage are shown in the order listed starting with the TFT on the left side of the figures.

First, as shown in FIG. 6A, a $SiO_2$ film is formed to a thickness of about 80 nm on a transparent insulated substrate 31 made of glass to provide a buffer layer 32. An amorphous silicon film is formed using plasma CVD and is annealed with an excimer laser to crystallize the amorphous silicon, thereby forming a polysilicon semiconductor layer 33 having a thickness of about 50 nm. A resist is then applied and patterned to form a resist mask. Dry etching is performed using the resist mask as an etching mask to form semiconductor layers 33a, 33b, 33c and 33d in the form of islands. Next, a $SiO_2$ film is formed to a thickness of about 30 nm on the semiconductor layers 33a, 33b, 33c and 33d to form a first gate insulation film 34. The first gate insulation film 34 serves as a gate insulation film for the TFTs for a low voltage.

Next, a Mo film is formed to a thickness of about 300 nm to provide a metal thin film. A resist is then applied and patterned to form a resist mask. Etching is performed using the resist mask as an etching mask to remove parts of the metal thin film associated with source and drain regions of the p-type TFT for a low voltage and the n-type TFT for a low voltage and parts associated with the p-type TFT for a high voltage and the n-type TFT for a high voltage. That is, the metal thin film is patterned to leave a gate electrode 35a of the p-type TFT for a low voltage and a gate electrode 35b of the n-type TFT for a low voltage. Next, a $SiO_2$ film is formed to a thickness of about 70 nm on the gate electrodes 35a and 35b to provide a second gate insulation film 36. Since the first gate insulation film 34 is a gate insulation film for the TFTs for a low voltage, the thickness of the same may be determined in accordance with the TFTs for a low voltage. Since the two gate insulation films, i.e., the first gate insulation film 34 and the second gate insulation film 36 constitute a gate insulation film for the TFTs for a high voltage, the thickness of the gate insulation film may be determined in accordance with the TFTs for a high voltage by adjusting the thickness of the second gate insulation film 36.

Next, as shown in FIG. 6B, an Al film to become gate electrodes of the TFTs for a high voltage is formed to a thickness of about 300 nm to provide a metal thin film. A resist is then applied and patterned to form resist masks 38a, 38b and 38c. Dry etching is performed using the resist masks 38a, 38b and 38c as etching masks to remove a part of the metal thin film associated with the n-type TFT for a low voltage and parts of the same associated with source and drain regions 333 of the n-type TFT for a high voltage. That is, the metal thin film is patterned to leave a part of the metal thin film having a width equal to or wider than the entire width of the p-type TFT for a low voltage, a part of the metal thin film having a width equal to or wider than the entire width of the p-type TFT for a high voltage and a part of the same associated with a channel region and LDD regions of the n-type TFT for a high voltage.

Side etching is thereafter performed on a wet etching basis. The purpose is to etch sides of Al metal thin films that have been left after the dry etching to reduce the widths of the metal thin films. That is, etching is performed to leave a part 37a of the metal thin film having a width equal to the entire width of the p-type TFT for a low voltage, a part 37b of the metal thin film having a width equal to the entire width of the p-type TFT for a high voltage and a part 37c of the metal thin film associated with the channel region of the n-type TFT for a high voltage (a gate electrode of the n-type TFT for a high voltage). In the case of the n-type TFT for a high voltage, since it is to be provided with LDD regions, the resist mask 38c has a width wider than that of the gate electrode 37c by an amount to accommodate the LDD regions.

Next, first doping is performed with the resist masks 38a, 38b and 38c left in place by implanting an n-type impurity such as phosphorous through the gate insulation films 34 and 36 at high acceleration and in a high dose amount (that are 90 keV and $1 \times 10^{15}$ $cm^{-2}$, respectively, for example) using the resist masks 38a, 38b and 38c and the gate electrode 35b of the n-type TFT for a low voltage as masks. Thus, source and drain regions 331 of the n-type TFT for a low voltage and the source and drain regions 333 of the n-type TFT for a high voltage are formed. Since the resist masks 38a, 38b and 38c wider than the metal thin films 37a, 37b and 37c serve as masks, the impurity is not implanted in the semiconductor layer 33a of the p-type TFT for a low voltage, the semiconductor layer 33c of the p-type TFT for a high voltage and a part 334 to become the LDD regions and the channel region of then-type TFT for a high voltage. Further, since the gate electrode of the n-type TFT for a low voltage also serves as a mask, the impurity is not implanted in a channel region 332 of the same.

Then, the resist masks 38a, 38b and 38c are removed. Next, as shown in FIG. 6C, second doping is performed by implanting an n-type impurity such as phosphorous through the first and second gate insulation films 34 and 36 at high acceleration and in a low dose amount (that are 90 keV and $5 \times 10^{13}$ $cm^{-2}$, respectively, for example) using the part 37a of the metal thin film for the p-type TFT for a low voltage, the gate electrode 35b of the n-type TFT for a low voltage, the part 37b of the metal thin film for the p-type TFT for a high voltage and the gate electrode 37c of the n-type TFT for a high voltage as masks. Thus, LDD regions 335 are formed in the semiconductor layer between the source or drain regions 333 of the n-type TFT for a high voltage and a channel region 336 of the same. Since the gate electrode of the n-type TFT for a low voltage also serves as a mask, the impurity is not implanted in a channel region 332 of the same.

Next, as shown in FIG. 6D, a resist is applied and patterned to form a resist mask 39a to cover the n-type TFT for a low voltage as a whole, a resist mask 39c to cover the n-type TFT for a high voltage as a whole and a resist mask 39b for forming a gate electrode 371 of the p-type TFT for a high voltage. This prevents the implantation of the p-type impurity into the n-type TFT for a low voltage and the n-type TFT for a high voltage and allows the formation of the gate electrode 371 of the p-type TFT for a high voltage. Etching is performed using the resist masks 39a, 39b and 39c to remove the part 37a of the metal thin film associated with the p-type TFT for a low voltage and parts of the metal thin film associated with the source and drain regions of the p-type TFT for a high voltage.

The width of the part 371 of the metal thin film may become narrower than the width of the resist mask 39b because sides of the same are shaved as generally encountered during etching of Al even if the etching method is dry etching. Therefore, when the p-type impurity such as boron is implanted without any countermeasure, the impurity is not implanted between the source and drain regions and the channel region of the p-type TFT for a high voltage to form the so-called offset structure.

Figure 7A:
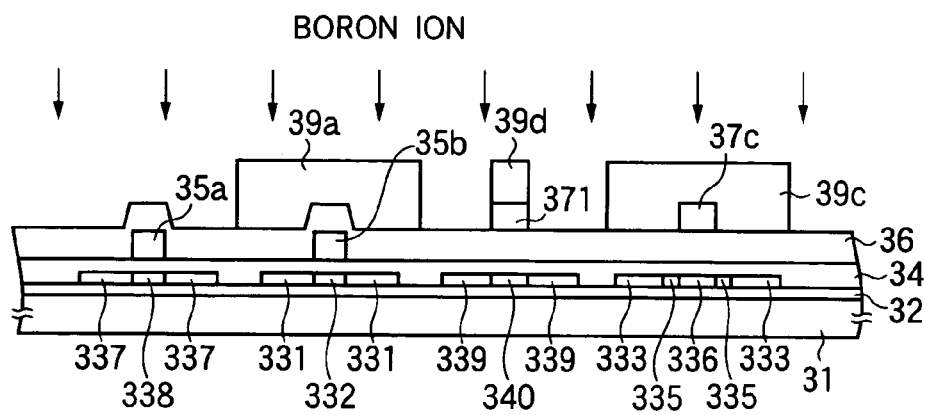
FIGS. 7A to 7C are sectional views taken in processes showing the configuration of the TFT substrate and the method of manufacturing the same according to Embodiment 3 in the mode of carrying out the invention.

Under such circumstances, as shown in FIG. 7A, the surface of the resist mask 39b is ashed in a plasma of oxygen to make the width of the same equal to or slightly narrower than that of the part 371 of the metal thin film, thereby forming a resist mask 39d. Thereafter, a p-type impurity such as boron is selectively implanted through the gate insulation films 34 and 36 at high acceleration and in a high dose amount (that are 70 keV and $1 \times 10^{15}$ cm$^{-2}$, respectively, for example) only in the p-type TFT for a high voltage and the p-type TFT for a low voltage using the resist masks 39a and 39c and the part 371 of the metal thin film (the gate electrode of the p-type TFT for a high voltage) as masks. Thus, source and drain regions 337 in the semiconductor layer of the p-type TFT for a low voltage and source and drain regions 339 in the semiconductor layer of the p-type TFT for a high voltage are formed. It is required to implant the impurity only once because the p-type TFTs are to be formed with no LDD region. The p-type impurity such as boron is not implanted in channel regions 338 and 340, the gate electrode 35a and the gate electrode 371 masking the p-type TFT for a low voltage and the p-type TFT for a high voltage, respectively.

The resist masks 39a, 39d and 39c are thereafter peeled off. Next, as shown in FIG. 7B, annealing is performed through a thermal process at about 500° C. or using an excimer laser to activate the n-type and p-type impurities.

Figure 7B:
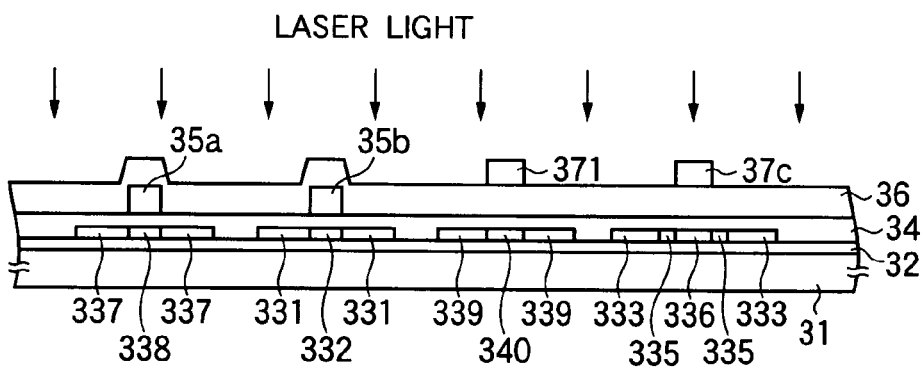
Figure 7C:
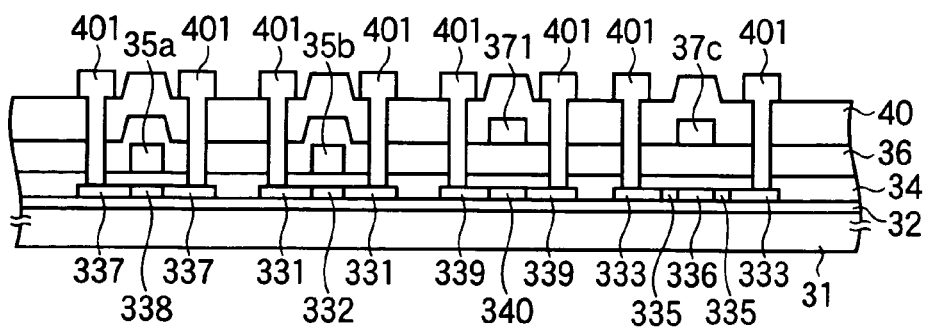

Next, as shown in FIG. 7C, a SiN film is formed to a thickness of about 300 nm to provide a layer insulation film 40, and contact holes are provided in the layer insulation film 40, the gate insulation films 34 and 36. An Al film is formed to a thickness of about 300 nm and is patterned to form wirings 401. This completes the n-type TFT for a low voltage, the p-type TFT for a low voltage, the n-type TFT for a high voltage and the p-type TFT for a high voltage. Although not shown, a protective film and pixel electrodes are formed further to complete the TFT substrate.

The implantation of the impurity to form the LDD regions 335 shown in FIG. 6C may be performed prior to the irradiation with laser light shown in FIG. 7B. That is, it may follow the removal of the resist masks 39a, 39d and 39c shown in FIG. 7A. While dry etching is followed by side etching in FIG. 6B to make the width of the metal thin film narrower than that of the resist mask 38c, side etching may be performed while etching the metal thin film simultaneously on a wet etching basis instead of using dry etching. The side etching may be performed after the first implantation of the n-type impurity (provided that it precedes the removal of the resist mask 38c).

In the present embodiment, the gate electrode 37c is side-etched to form the LDD regions 335, and the source and drain regions 333 of the n-type TFT for a high voltage are formed using the resist mask 38c that has been used to etch the metal thin film as a mask. This allows deletion of one manufacturing step, i.e., a photolithographic step when compared to Embodiment 2. The channel lengths (or the widths of the gate electrodes 35a and 35b) of the TFTs for a low voltage must be made as short as possible to achieve a high speed operation, and it is impractical to positively use side etching of the gate electrodes that is difficult to control. In the present embodiment, the gate electrodes of the TFTs for a low voltage and the TFTs for a high voltage are formed at separate steps. That is, side etching creates no particular problem in the present embodiment because it is performed to form LDDs only at the gate electrodes of the TFTs for a high voltage for which a short channel length is not a so significant requirement. When the LDD regions 335 are formed using side etching, there is an advantage in that it is not required to achieve mask registration with high accuracy of about 1 to 3 μm when the gate electrode 37c is formed.

Embodiment 4

A description will now be made with reference to FIGS. 8A to 9C on a method of manufacturing a TFT substrate according to Embodiment 4 in the present mode for carrying out the invention. FIGS. 8A to 9C are sectional views taken in processes showing a configuration of a TFT substrate and a method of manufacturing the same. In FIGS. 8A to 9C, a p-type TFT for a low voltage, an n-type TFT for a low voltage, a p-type TFT for a high voltage and an n-type TFT for a high voltage are shown in the order listed starting with the TFT on the left side of the figures.

Figure 8A:
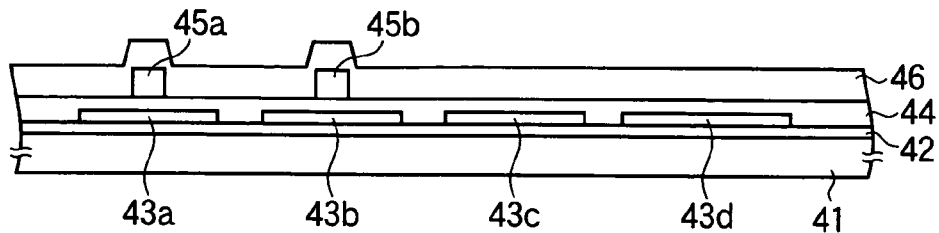
FIGS. 8A to 8C are sectional views taken in processes showing a configuration of a TFT substrate and a method of manufacturing the same according to Embodiment 4 in the mode of carrying out the invention.

First, as shown in FIG. 8A, a SiO$_2$ film is formed to a thickness of about 80 nm on a transparent insulated substrate 41 made of glass to provide a buffer layer 42. Next, an amorphous silicon film is formed using plasma CVD and is annealed with an excimer laser to crystallize the amorphous silicon, thereby forming a polysilicon semiconductor layer 43 having a thickness of about 50 nm. A resist is then applied and patterned to form a resist mask. Dry etching is performed using the resist mask as an etching mask to form semiconductor layers 43a, 43b, 43c and 43d in the form of islands. A SiO$_2$ film is formed to a thickness of about 30 nm on the semiconductor layers 43a, 43b, 43c and 43d to provide a first gate insulation film 44. The first gate insulation film 44 serves as a gate insulation film for the TFTs for a low voltage.

Next, a Mo film is formed to a thickness of about 300 nm to provide a metal thin film. A resist is then applied and patterned to form a resist mask. Etching is performed using the resist mask as an etching mask to remove parts of the metal thin film associated with source and drain regions of the p-type TFT for a low voltage and the n-type TFT for a low voltage and parts associated with the p-type TFT for a high voltage and the n-type TFT for a high voltage. That is, the metal thin film is patterned to leave a gate electrode 45a of the p-type TFT for a low voltage and a gate electrode 45b of the n-type TFT for a low voltage. Next, a SiO$_2$ film is formed to a thickness of about 70 nm on the gate electrodes 45a and 45b to provide a second gate insulation film 46. Since the first gate insulation film 44 is a gate insulation film for the TFTs for a low voltage, the thickness of the same may be determined in accordance with the TFTs for a low voltage. Since the two gate insulation films, i.e., the first gate insulation film 44 and the second gate insulation film 46 constitute a gate insulation film for the TFTs for a high voltage, the thickness of the gate insulation film may be determined in accordance with the TFTs for a high voltage by adjusting the thickness of the second gate insulation film 46.

Figure 8B:
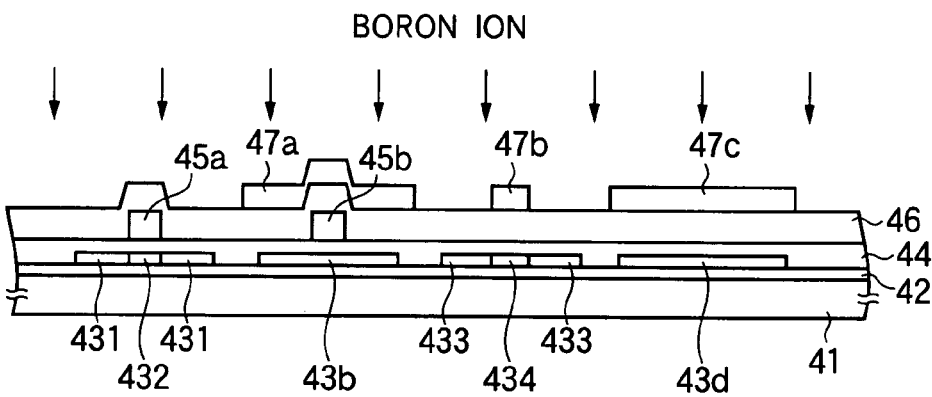

Next, as shown in FIG. 8B, an Al film to become gate electrodes of the TFTs for a high voltage is formed to a thickness of about 300 nm to provide a metal thin film. A resist is then applied and patterned to form a resist mask. Etching is performed using the resist mask as an etching mask to remove a part of the metal thin film associated with the p-type TFT for a low voltage and parts of the same associated with source and drain regions 433 of the p-type TFT for a high voltage. That is, the metal thin film is patterned to leave a part 47*a* of the metal thin film having a width equal to or wider than the entire width of the n-type TFT for a low voltage, a part 47*c* of the metal thin film having a width equal to or wider than the entire width of the n-type TFT for a high voltage and a gate electrode 47*b* of the p-type TFT for a high voltage. The resist mask is thereafter removed.

Next, as shown in FIG. 8B, a p-type impurity such as boron is implanted at high acceleration and in a high dose amount (that are 70 keV and $1 \times 10^{15}$ cm$^{-2}$, respectively, for example) using the part 47*a* of the metal film having a width equal to or wider than the entire width of the n-type TFT for a low voltage, the gate electrode 45*a* of the p-type TFT for a low voltage, the gate electrode 47*b* of the p-type TFT for a high voltage, and the part 47*c* of the metal thin film having a width equal to or wider than the entire width of the n-type TFT for a high voltage as masks. Thus, source and drain regions 431 in the semiconductor layer of the p-type TFT for a low voltage and source and drain regions 433 in the semiconductor layer of the p-type TFT for a high voltage are formed. Since the p-type TFTs are to be formed with no LDD, it is required to implant the impurity only once. During the implantation, the p-type impurity such as boron is not implanted in a channel region 432 of the p-type TFT for a low voltage and a channel region 434 of the p-type TFT for a high voltage.

Figure 8C:
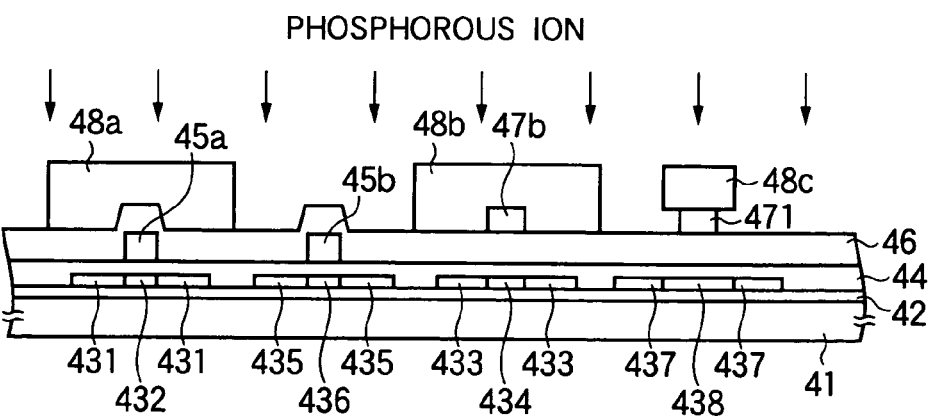

Next, as shown in FIG. 8C, a resist is then applied and patterned to form a resist mask 48*a* to cover the p-type TFT for a low voltage as a whole, a resist mask 48*b* to cover the p-type TFT for a high voltage as a whole, and a resist mask 48*c* to cover the metal thin film in parts to become a channel region and LDD regions of the n-type TFT for a high voltage. Dry etching is performed using the resist masks 48*a*, 48*b* and 48*c* as etching masks to remove a part of the metal thin film made of Al associated with the n-type TFT for a low voltage and parts of the same associated with source and drain regions 437 of the n-type TFT for a high voltage. That is, the metal thin film is patterned to leave parts thereof associated with regions that are to become the gate electrode 47*b* of the p-type TFT for a high voltage and the LDD regions and a channel region 438 of the n-type TFT for a high voltage.

Side etching is thereafter performed on a wet etching basis. The purpose is to etch sides of a metal thin film made of Al that has been left after the dry etching, thereby reducing the width of the metal thin film. Specifically, etching is performed to leave a part 471 of the metal thin film associated with the channel region of the n-type TFT for a high voltage (a gate electrode of the n-type TFT for a high voltage). Since then-type TFT for a high voltage is to be provided with LDD regions, the width of the resist mask 48*c* is greater than that of the gate electrode 471 by an amount to accommodate the LDD regions.

Subsequently, first doping is performed with the resist masks 48*a*, 48*b* and 48*c* left in place by implanting an n-type impurity such as phosphorous at high acceleration and in a high dose amount (that are 90 keV and $1 \times 10^{15}$ cm$^{-2}$, respectively, for example) through the gate insulation films 44 and 46 using the resist masks 48*a*, 48*b* and 48*c* and the gate electrode 45*b* of the n-type TFT for a low voltage as masks. Thus, source and drain regions 435 of the n-type TFT for a low voltage and source and drain regions 437 of the n-type TFT for a high voltage are formed. Since the resist mask 48*c* having a width wider than that of the part 471 of the metal thin film serves as a mask, the impurity is not implanted in a part 438 that is to become the LDD regions of and the channel region of the n-type TFT for a high voltage. The n-type impurity is not implanted in the p-type TFT for a low voltage and the p-type TFT for a high voltage because of the resist masks 48*a* and 48*b*. Further, since the gate electrode 45*b* of the n-type TFT for a low voltage serves as a mask, the n-type impurity is not implanted in a channel region 436 of the same too.

Figure 9A:
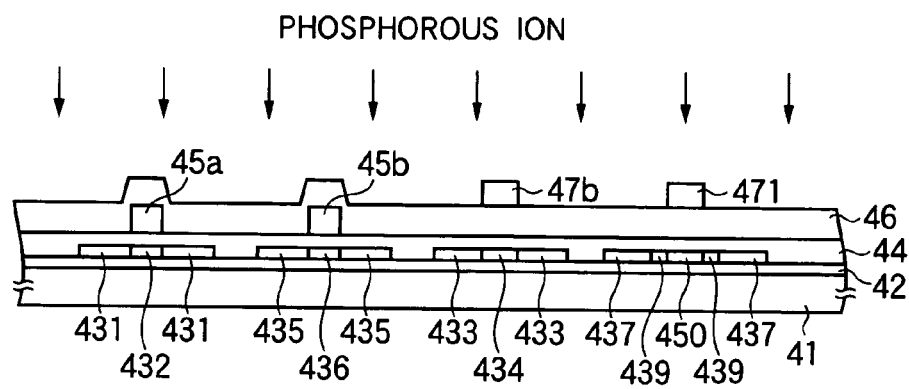
FIGS. 9A to 9C are sectional views taken in processes showing the configuration of the TFT substrate and the method of manufacturing the same according to Embodiment 4 in the mode of carrying out the invention.

The resist masks 48*a*, 48*b* and 48*c* are then removed. Next, as shown in FIG. 9A, second doping is performed by implanting an n-type impurity such as phosphorous through the gate insulation films 44 and 46 at high acceleration and in a low dose amount (that are 90 keV and $5 \times 10^{13}$ cm$^{-2}$, respectively, for example) using the remaining parts 47*b* and 471 of the metal thin film made of Al, the gate electrode 45*a* of the p-type TFT for a low voltage, and the gate electrode 45*b* of the n-type TFT for a low voltage as masks. Thus, LDD regions 439 are formed in the semiconductor layer between the source or drain regions 437 and a channel region 450 of the n-type TFT for a high voltage. The n-type impurity is also implanted at high acceleration and in a low dose amount in both of the source and drain regions 431 of the p-type TFT for a low voltage and the source and drain regions 433 of the p-type TFT for a high voltage. The n-type impurity is not implanted in the channel region 434 of the p-type TFT for a high voltage and the channel region 450 of the n-type TFT for a high voltage because the gate electrodes 47*b* and 471 serve as masks. The n-type impurity is not implanted in the channel regions 432 and 436 because the gate electrode 45*a* of the p-type TFT for a low voltage and the gate electrode 45*b* of the n-type TFT for a low voltage serve as masks.

Figure 9B:
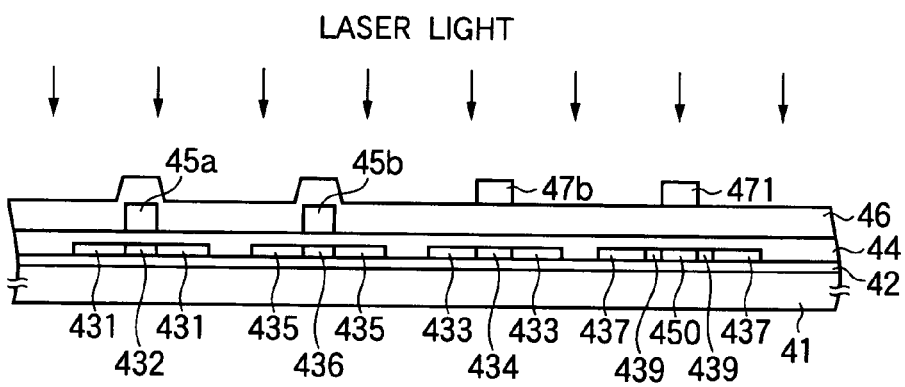

Next, as shown in FIG. 9B, annealing is performed through a thermal process at about 500° C. or using an excimer laser to activate the n-type and p-type impurities.

Figure 9C:
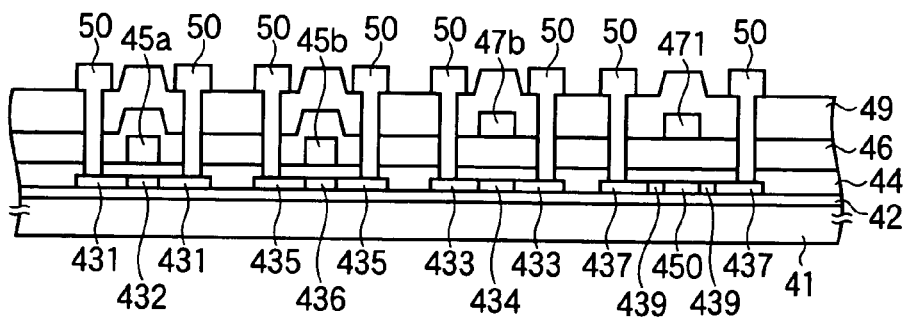

Next, as shown in FIG. 9C, a SiN film is formed to a thickness of about 300 nm to provide a layer insulation film 49, and contact holes are provided in the layer insulation film 49, the gate insulation films 44 and 46. Further, an Al film is formed to a thickness of about 300 nm and is patterned to form wirings 50. This completes the n-type TFT for a low voltage, the p-type TFT for a low voltage, the n-type TFT for a high voltage and the p-type TFT for a high voltage. Although not shown, a protective film and pixel electrodes are formed further to complete the TFT substrate.

The process of implanting impurities using resist masks (or ion doping or ion shower) in the present embodiment involves only one step that is shown in FIG. 8C. On the contrary, Embodiment 3 involves two steps for implanting impurities using resist masks. Ashing must be performed for a long time using a plasma of oxygen to remove the resist after implanting the impurities. Thus, the present embodiment makes it possible to manufacture a TFT substrate in a shorter time compared to Embodiment 3. While side etching is performed on the metal thin film to make the width of the metal thin film narrower than that of the resist mask 48*c* in FIG. 8C, side etching may be performed after the first implantation of an n-type impurity and before the resist mask 48*c* is peeled off.

In the present embodiment, when the n-type impurity is implanted in the LDD regions 439 shown in FIG. 9A, the n-type impurity is also implanted in the source and drain regions 431 and 433 of the p-type TFTs, which however has substantially negligible influence because the amount introduced is equal to or less than one-tenth the amount of the p-type impurity implanted in the source and drain regions 431 and 433 of the p-type TFTs at the step shown in FIG. 8B.

No LDD is formed at the p-type TFTs in the present embodiment. Since degradation attributable to hot carriers is not a so serious concern for p-type TFTs, there is no particular need for forming them with LDDs, and it is rather preferable to form no LDD in order to improve driving capability.

Embodiment 5

A description will now be made with reference to FIGS. 10A and 11C on a method of manufacturing a TFT substrate according to Embodiment 5 in the present mode for carrying out the invention as a modification of Embodiment 2. FIGS. 10A to 11C are sectional views taken in processes showing a configuration of a TFT substrate and a method of manufacturing the same. In FIGS. 10A to 11C, a p-type TFT for a low voltage, an n-type TFT for a low voltage, a p-type TFT for a high voltage and an n-type TFT for a high voltage are shown in the order listed starting with the TFT on the left side of the figures.

First, as shown in FIG. 10A, a $SiO_2$ film is formed to a thickness of about 80 nm on a transparent insulated substrate 61 made of glass to provide a buffer layer 62. An amorphous silicon film is formed using plasma CVD and is annealed with an excimer laser to crystallize the amorphous silicon, thereby forming a polysilicon semiconductor layer 63 having a thickness of about 50 nm. A resist is then applied and patterned to form a resist mask. Etching is performed using the resist mask as an etching mask to form semiconductor layers 63a, 63b, 63c and 63d in the form of islands. Next, a $SiO_2$ film is formed to a thickness of about 30 nm on the semiconductor layers 63a, 63b, 63c and 63d to provide a first gate insulation film 64. The first gate insulation film 64 serves as a gate insulation film for the TFTs for a low voltage.

Next, a Mo film is formed to a thickness of about 300 nm to provide a metal thin film. A resist is then applied and patterned to form a resist mask. Etching is performed using the resist mask as an etching mask to remove parts of the metal thin film associated with source and drain regions of the p-type TFT for a low voltage and the n-type TFT for a low voltage and parts associated with of the p-type TFT for a high voltage and the n-type TFT for a high voltage. That is, the metal thin film is patterned to leave a gate electrode 65a of the p-type TFT for a low voltage and a gate electrode 65b of the n-type TFT for a low voltage. Next, a $SiO_2$ film is formed to a thickness of about 70 nm on the gate electrodes 65a and 65b to provide a second gate insulation film 66. Since the first gate insulation film 64 is a gate insulation film for the TFTs for a low voltage, the thickness of the same may be determined in accordance with the TFTs for a low voltage. Since the two gate insulation films, i.e., the first gate insulation film 64 and the second gate insulation film 66 constitute a gate insulation film for the TFTs for a high voltage, the thickness of the gate insulation film may be determined in accordance with the TFTs for a high voltage by adjusting the thickness of the second gate insulation film 66.

Next, as shown in FIG. 10B, an Al film to become gate electrodes of the TFTs for a high voltage is formed to a thickness of about 300 nm to provide a metal thin film. A resist is then applied and patterned to form resist masks 68a and 68b. Dry etching is performed using the resist masks 68a and 68b as etching masks to remove parts of the metal thin film made of Al associated with the n-type TFT for a low voltage and the p-type TFT for a low voltage, a part 635 of the same having a width narrower than that of source and drain regions of the p-type TFT for a high voltage and parts of the same associated with source and drain regions 637 of the n-type TFT for a high voltage. That is, the dry etching leaves a part of the metal thin film having a width wider than that of a gate electrode of the p-type TFT for a high voltage, a part of the metal thin film associated width LDD regions and a channel region of the n-type TFT for a high voltage.

Side etching is then performed on a wet etching basis. The purpose is to etch sides of metal thin films that have been left after the dry etching such that the widths of the metal thin films are reduced. Thus, a gate electrode 67a of the p-type TFT for a high voltage and a gate electrode 67b of the n-type TFT for a high voltage are formed. In order to provide then-type TFT for a high voltage with LDD regions, the width of the resist mask 68b is wider than that of the gate electrode 67b by an amount to accommodate the LDD regions. The width of the resist mask 68a is wider than that of the gate electrode 67a, although the p-type TFT for a high voltage is formed with no LDD region.

First doping is then performed with the resist masks 68a and 68b left in place by implanting an n-type impurity such as phosphorous through the gate insulation films 64 and 66 at high acceleration and in a high dose amount (that are 90 keV and $1 \times 10^{15}$ $cm^{-2}$, respectively, for example) using the resist masks 68a and 68b, the gate electrode 65a of the p-type TFT for a low voltage and the gate electrode 65b of the n-type TFT for a low voltage as masks. Thus, source and drain regions 633 of the n-type TFT for a low voltage and source and drain regions 637 of the n-type TFT for a high voltage are formed. Since the resist mask 68b having a width wider than that of the metal thin film 67b serves as a mask, the impurity is not implanted in a part 638 that is to become the LDD regions and the channel region of the n-type TFT for a high voltage. Further, since the gate electrode 65b of the n-type TFT for a low voltage also serves as a mask, the n-type impurity is not implanted in a channel region 634. However, the n-type impurity is implanted in parts 631 that are to become source and drain regions of the p-type TFT for a low voltage and parts 635 to become source and drain regions of the p-type TFT for a high voltage.

The resist masks 68a and 68b are then removed. Next, as shown in FIG. 10C, second doping is performed by implanting an n-type impurity such as phosphorous through the gate insulation films 64 and 66 at high acceleration and in a low dose amount (that are 90 keV and $5 \times 10^{13}$ $cm^{-2}$, respectively, for example) using the gate electrode 65a of the p-type TFT for a low voltage, the gate electrode 65b of the n-type TFT for a low voltage, the gate electrode 67a of the p-type TFT for a high voltage and the gate electrode 67b of the n-type TFT for a high voltage as masks. Thus, LDD regions 641 are formed in the semiconductor layer between the source or drain regions 637 and a channel region 642 of the n-type TFT for a high voltage. The p-type TFT for a high voltage and the n-type TFT for a high voltage that has LDD regions are formed in substantially the same configuration up to this step. Similarly, the p-type TFT for a low voltage and the n-type TFT for a low voltage are formed in substantially the same configuration up to this step. That is, all of the TFTs are formed as n-type TFTs up to this step.

Figure 11A:
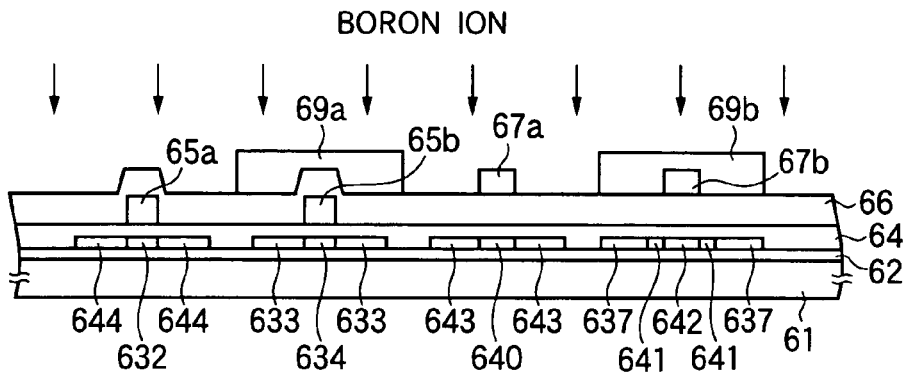
FIGS. 11A to 11C are sectional views taken in processes showing the configuration of the TFT substrate and the method of manufacturing the same according to Embodiment 5 in the mode of carrying out the invention.

Next, as shown in FIG. 11A, a resist is applied and patterned to form a resist mask 69a to cover the n-type TFT for a low voltage as a whole and a resist mask 69b to cover the n-type TFT for a high voltage as a whole. This prevents implantation of a p-type impurity into the n-type TFT for a low voltage and the n-type TFT for a high voltage.

Next, as shown in FIG. 1A, a p-type impurity such as boron is selectively implanted through the gate insulation films 64 and 66 only into the p-type TFT for a high voltage and the p-type TFT for a low voltage at high acceleration and in a high dose amount (that are 70 keV and 2×10$^1$ cm$^{-2}$ respectively, for example) using the resist masks 69a and 69b, the gate electrode 67a of the p-type TFT for a high voltage and the gate electrode 65a of the p-type TFT for a low voltage as masks. Thus, source and drain regions 644 of the p-type TFT for a low voltage and source and drain regions 643 of the p-type TFT for a high voltage are formed. The n-type impurity has been implanted in the source and drain regions 644 and 643 at the previous step. Therefore, the p-type impurity is implanted in the source and drain regions 644 and 643 in an amount that is about twice the amount of the n-type impurity to invert the source and drain regions 644 and 643 into the p-type. Since the p-type TFTs are to be formed with no LDD region, it is required to implant the impurity only once. The p-type impurity is not implanted in channel regions 632 and 640 because the gate electrode 65a serves as a mask for the p-type TFT for a low voltage and the gate electrode 67a serves as a mask for the p-type TFT for a high voltage.

Figure 11B:
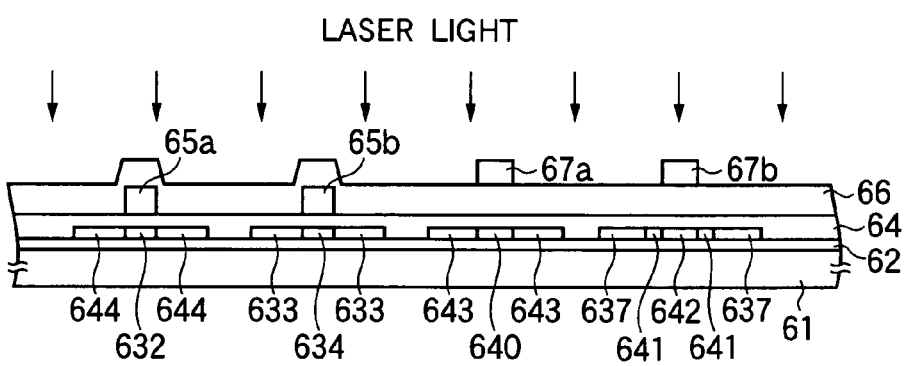
Figure 11C:
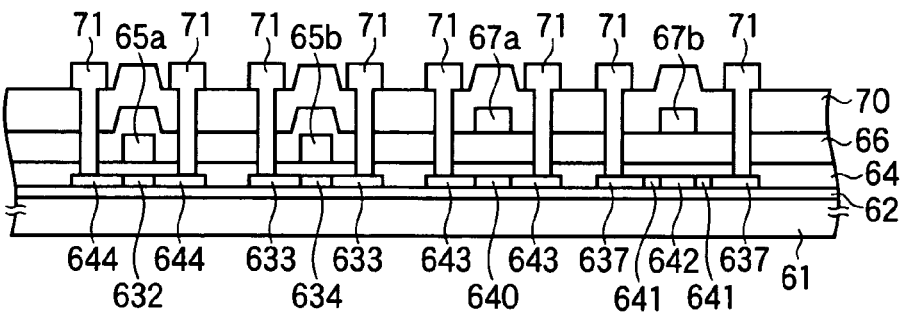
Figure 12A:
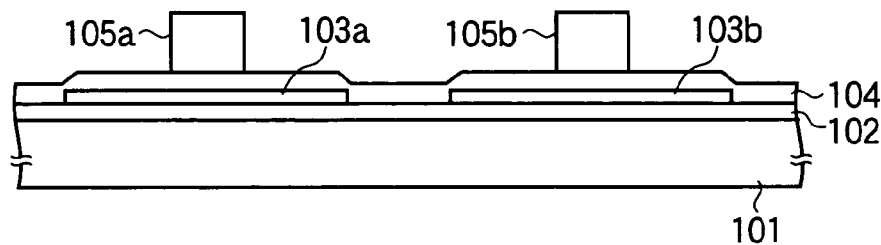
FIGS. 12A to 12C are sectional views taken in processes showing a configuration of a TFT substrate and a method of manufacturing the same according to a first example of the related art.
Figure 12B:
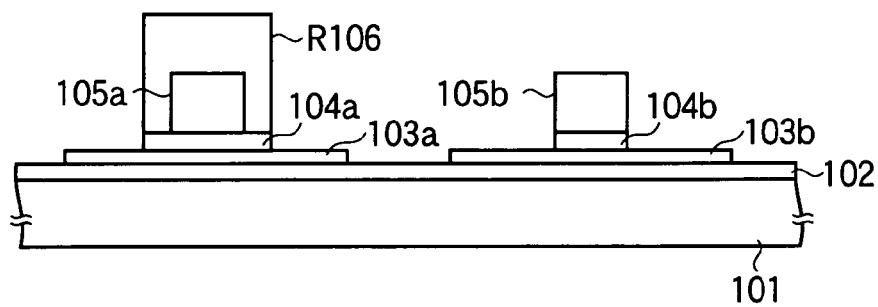
Figure 12C:
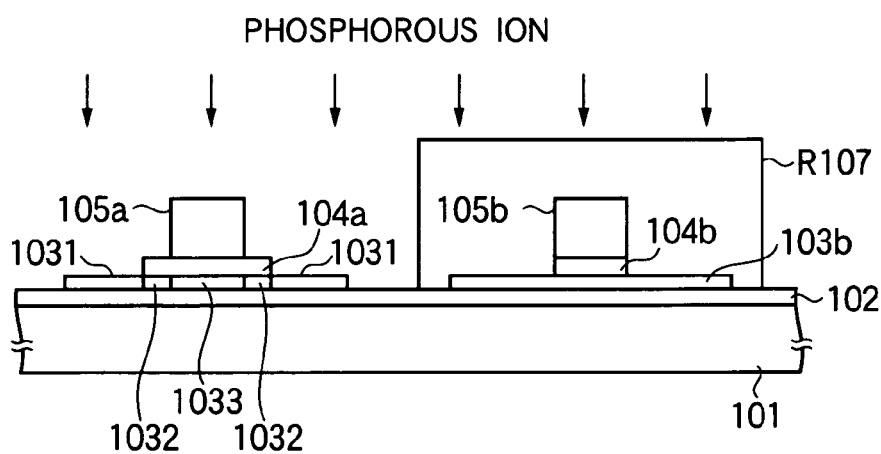
Figure 13A:
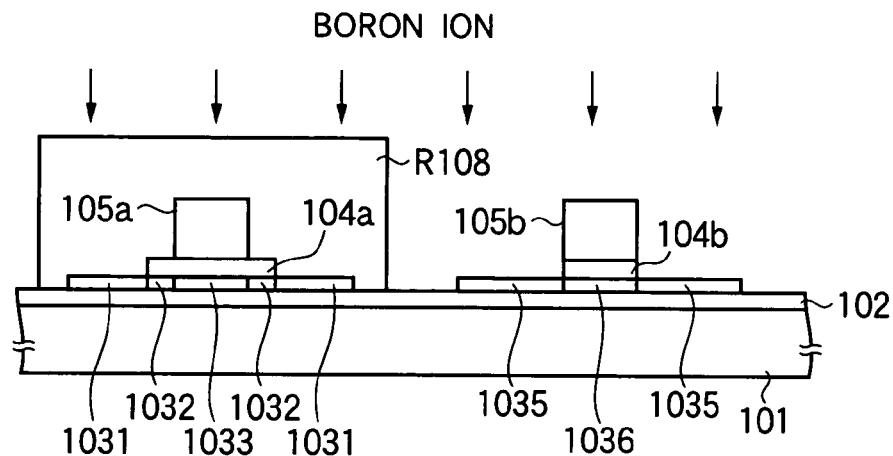
FIGS. 13A to 13C are sectional views taken in processes showing the configuration of the TFT substrate and the method of manufacturing the same according to a first example of the related art.
Figure 13B:
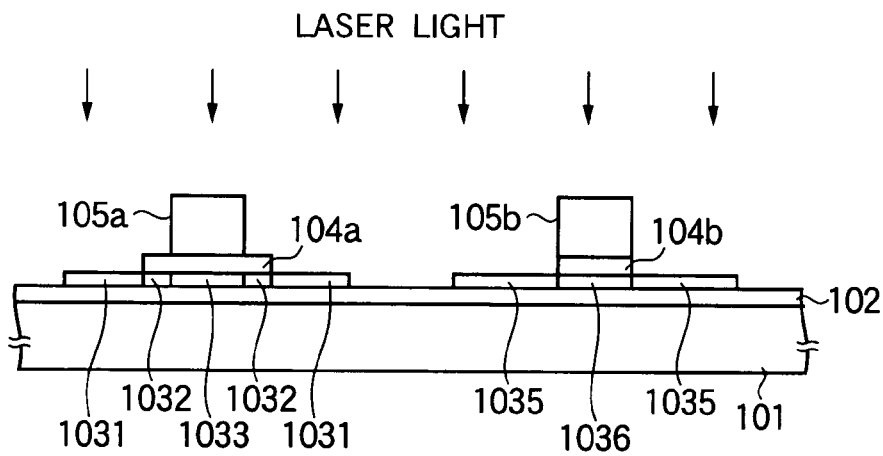
Figure 13C:
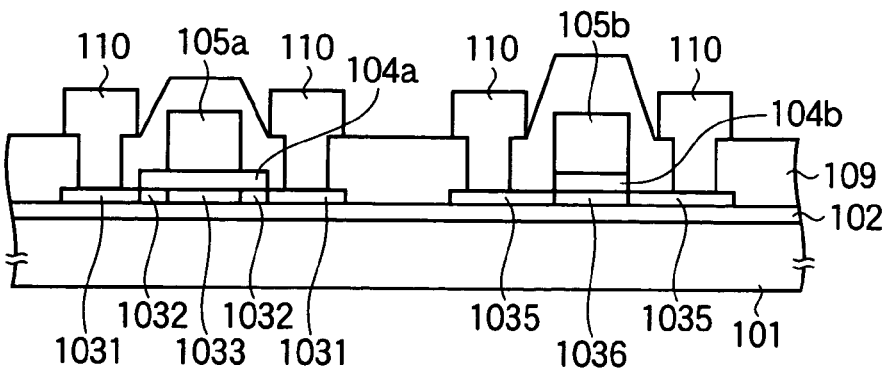
Figure 14A:
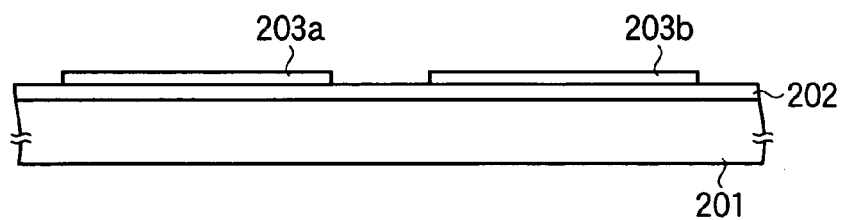
FIGS. 14A to 14C are sectional views taken in processes showing a configuration of a TFT substrate and a method of manufacturing the same according to a second example of the related art.
Figure 14B:
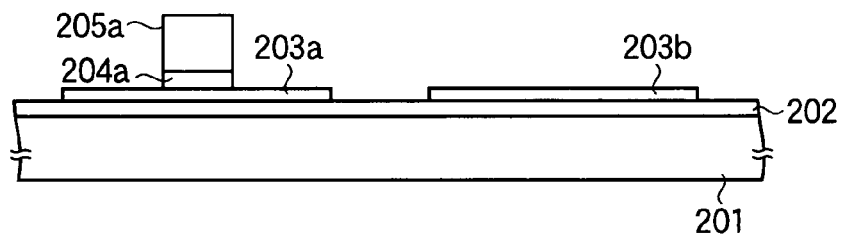
Figure 14C:
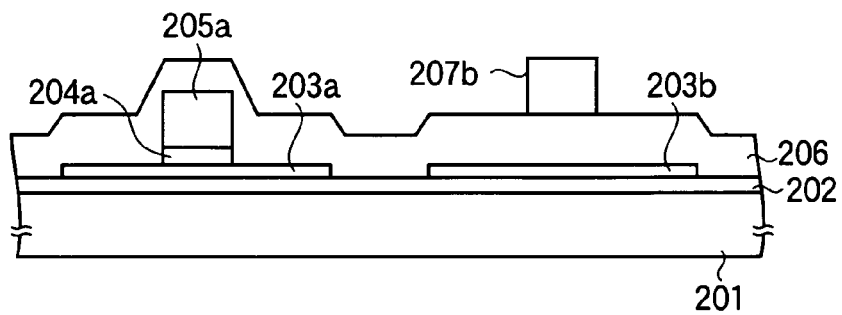
Figure 15A:
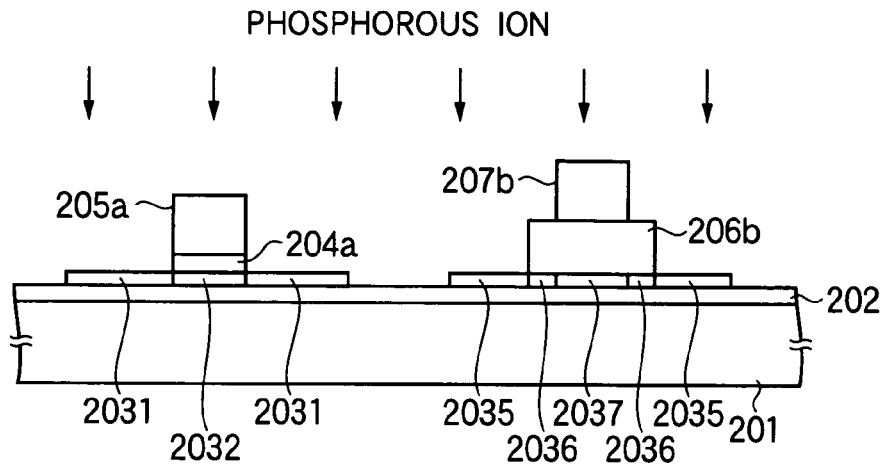
FIGS. 15A to 15C are sectional views taken in processes showing the configuration of the TFT substrate and the method of manufacturing the same according to the second example of the related art.
Figure 15B:
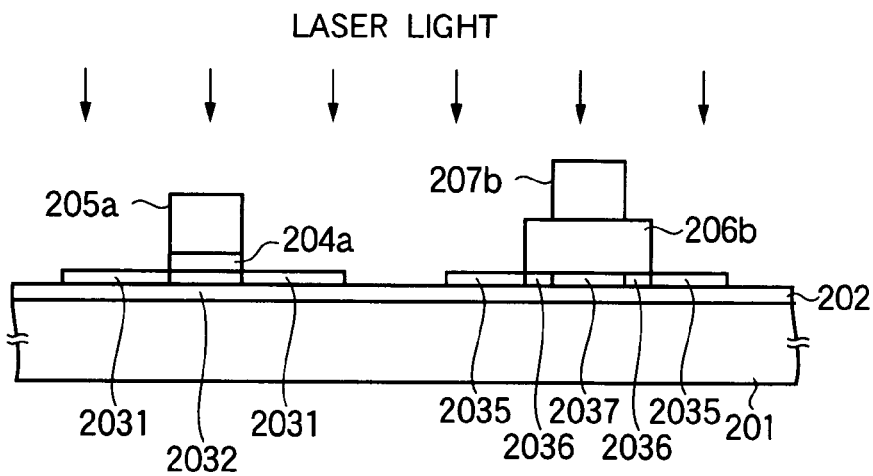
Figure 15C:
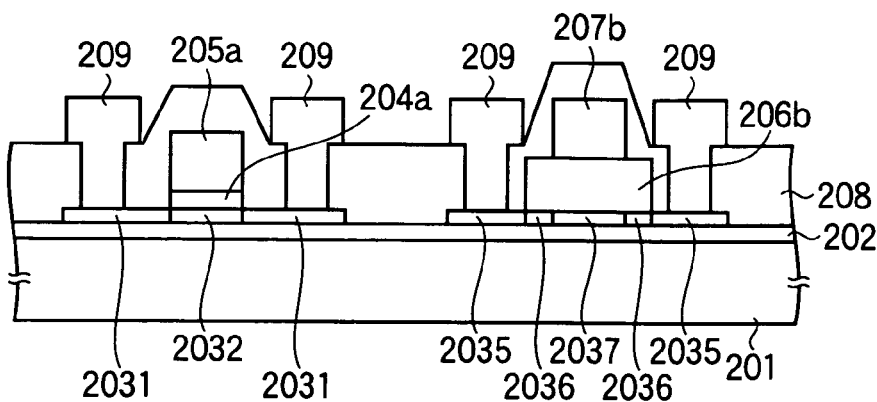

Next, as shown in FIG. 11B, the resist masks 69a and 69b are removed. Annealing is then performed through a thermal process at about 500° C. or using an excimer laser to activate the n-type and p-type impurities.

Next, as shown in FIG. 1C, a SiN film is formed to a thickness of about 300 nm to provide a layer insulation film 70, and contact holes are provided in the layer insulation film 70, the gate insulation films 64 and 66. An Al film is formed to a thickness of about 300 nm and is patterned to form wirings 71. This completes the n-type TFT for a low voltage, the p-type TFT for a low voltage, the n-type TFT for a high voltage and the p-type TFT for a high voltage. Although not shown, a protective film and pixel electrodes are formed further to complete the TFT substrate.

The present embodiment is different from Embodiments 2 to 4 in that the etching of the gate electrodes involves only one step because the gate electrode 67b of the n-type TFT for a high voltage and the gate electrode 67a of the p-type TFT for a high voltage are simultaneously processed. However, since a high dose amount of the n-type impurity is implanted also into the p-type TFTs, inversion doping is required to form the source and drain regions 643 and 644 of the p-type TFTs. Ion implantation utilizing resist masks in the present embodiment also involves two steps. The implantation of the n-type impurity to form LDDs shown in FIG. 10C may be performed after implanting the p-type impurity into the source and drain regions of the p-type TFTs and peeling off the resist masks 69a and 69b provided that it precedes irradiation with laser light as shown in FIG. 11B. Further, while side etching follows dry etching of the metal thin film to make the widths of the gate electrodes 67a and 67b narrower than the widths of the resist masks 68a and 68b as shown in FIG. 10B in the present embodiment, the side etching may be performed after the first implantation of the n-type impurity (provided that it precedes the removal of the resist masks 68a and 68b).

While five embodiments in the present mode for carrying out the invention have been described above, the invention is not limited to them. In particular, structures similar to those in Embodiments 2 to 5 may be provided using manufacturing methods other than those described above. Specifically, any manufacturing method may be employed provided that first and second gate insulation films are separately formed and that an n-type TFT for a high voltage, a p-type TFT for a high voltage, an n-type TFT for a low voltage and a p-type TFT for a low voltage can be simultaneously manufactured through a common manufacturing process that allows LDDs to be provided without etching the gate insulation films.

While a liquid crystal display has been referred to as an example in the present mode for carrying out the invention, the invention is not limited to the same and may be applied to other displays such as organic EL displays and inorganic EL displays.

As described above, the invention makes it possible to provide a thin film transistor device having good characteristics and high reliability.

There will be no difference between energies to activate impurities implanted in source and drain regions and LDD regions of a TFT. Further, it is possible to suppress a leak current between a gate electrode and a semiconductor layer of a TFT.

No problem arises even when the thickness of a gate insulation film for a TFT for a low voltage is reduced. Further, an LDD length of each TFT can be easily controlled, and TFTs having no LDD can be selectively formed.

Furthermore, it is possible to provide n-type and p-type TFTs formed without etching gate insulation films, TFTs for a low voltage and TFTs for a high voltage or a combination of the same, a TFT substrate including such TFTs and a display including such a TFT substrate.

What is claimed is:

1. A substrate for a thin film transistor, comprising:
   a plurality of bus lines formed on a substrate such that they intersect each other with an insulation film interposed;
   pixel regions provided in the form of a matrix in a display area on the substrate;
   and a thin film transistor device formed at a peripheral circuit provided around the display area;
   wherein the thin film transistor device includes:
   a first thin film transistor of a first conductivity type including a semiconductor layer formed on the substrate, a first gate insulation film formed on the semiconductor layer, a second gate insulation film formed on the first gate insulation film, and a first gate electrode formed on the second gate insulation film, a low density impurity region being formed between source and drain regions and a channel region of the semiconductor layer; and
   a second thin film transistor including the semiconductor layer, the first gate insulation film, a second gate electrode formed on the first gate insulation film, and an insulation film formed on the second gate electrode and being of the same material as the second gate insulation film.

2. A display comprising:
   a substrate having thin film transistors as switching elements,
   wherein the substrate includes:
   a plurality of bus lines formed on the substrate such that they intersect each other with an insulation film interposed;
   pixel regions provided in the form of a matrix in a display area on the substrate;
   and a thin film transistor device formed at a peripheral circuit provided around the display area;
   wherein the thin film transistor device includes:
   a first thin film transistor of a first conductivity type including a semiconductor layer formed on the substrate, a first gate insulation film formed on the semiconductor layer, a second gate insulation film formed on the first gate insulation film, and a first gate electrode formed on the second gate insulation film, a low density impurity region being formed between source and drain regions and a channel region of the semiconductor layer; and a second thin film transistor including the semiconductor layer, the first gate insulation film, a second gate electrode formed on the first gate insulation film, and an insulation film formed on the second gate electrode and being of the same material as the second gate insulation film.

3. A substrate for a thin film transistor according to claim 1, further comprising:

a third thin film transistor of a second conductivity type including the semiconductor layer, the first gate insulation film, the second gate insulation film, and the first gate electrode.

4. A display according to claim 2, wherein the substrate further comprises:

a third thin film transistor of a second conductivity type including the semiconductor layer, the first gate insulation film, the second gate insulation film, and the first gate electrode.

* * * * *